United States Patent
Ishikawa

(10) Patent No.: US 6,314,048 B1
(45) Date of Patent: Nov. 6, 2001

(54) SEMICONDUCTOR MEMORY DEVICE FOR FAST ACCESS

(75) Inventor: Masatoshi Ishikawa, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/800,785

(22) Filed: Mar. 8, 2001

(30) Foreign Application Priority Data

Apr. 28, 2000 (JP) .................................................. 12-131154

(51) Int. Cl.⁷ ...................................................... G11C 8/10
(52) U.S. Cl. ................... 365/230.06; 365/230.03; 365/230.08; 365/238.5; 365/190
(58) Field of Search .................. 365/230.06, 230.03, 365/238.5, 190, 230.08

(56) References Cited

U.S. PATENT DOCUMENTS

| | | | |
|---|---|---|---|
| 5,742,539 | * | 4/1998 | Kinugasa et al. ...................... 365/49 |
| 5,812,483 | * | 9/1998 | Jeon et al. ...................... 365/230.06 |
| 5,841,728 | * | 11/1998 | Pascucci et al. ................ 365/230.06 |
| 5,903,511 | * | 5/1999 | Gillingham ..................... 365/230.06 |

FOREIGN PATENT DOCUMENTS 9-265776    10/1997    (JP) ............................. G11C/11/401

OTHER PUBLICATIONS

"Fast Cycle RAM (FCRAM); a 20–ns Random Row Access, Pipe–Lined Operating DRAM", by Yasuharu Sato et al., 1998 Symposium on VLSI Circuits Digest of Technical Papers, pp. 22–25.

* cited by examiner

Primary Examiner—Andrew Q. Tran
(74) Attorney, Agent, or Firm—McDermott, Will & Emery

(57) ABSTRACT

Rapid data transfer and reduction in power consumption can be achieved by reducing the number of row accesses. A pattern of the memory regions to be selected in memory array is changed by word line mode designation of word line mode control circuit. Memory cells in the same row are selected in a line mode, whereas memory cells in different rows are simultaneously selected in a box mode.

14 Claims, 15 Drawing Sheets

| ROW ADDRESS | | | /SD SIGNAL ACTIVATED IN BOX MODE | | | | | | | | | | | | | | | |
|---|---|---|---|---|---|---|---|---|---|---|---|---|---|---|---|---|---|---|
| X2 | X1 | X0 | SDEC0 | 1 | 2 | 3 | 4 | 5 | 6 | 7 | 8 | 9 | 10 | 11 | 12 | 13 | 14 | 15 |
| 0 | 0 | 0 | /SD0 | 0 | 1 | 1 | 2 | 2 | 3 | 3 | 4 | 4 | 5 | 5 | 6 | 6 | 7 | 7 |
| 0 | 0 | 1 | /SD1 | 1 | 2 | 2 | 3 | 3 | 4 | 4 | 5 | 5 | 6 | 6 | 7 | 7 | 0 | 0 |
| 0 | 1 | 0 | /SD2 | 2 | 3 | 3 | 4 | 4 | 5 | 5 | 6 | 6 | 7 | 7 | 0 | 0 | 1 | 1 |
| 0 | 1 | 1 | /SD3 | 3 | 4 | 4 | 5 | 5 | 6 | 6 | 7 | 7 | 0 | 0 | 1 | 1 | 2 | 2 |
| 1 | 0 | 0 | /SD4 | 4 | 5 | 5 | 6 | 6 | 7 | 7 | 0 | 0 | 1 | 1 | 2 | 2 | 3 | 3 |
| 1 | 0 | 1 | /SD5 | 5 | 6 | 6 | 7 | 7 | 0 | 0 | 1 | 1 | 2 | 2 | 3 | 3 | 4 | 4 |
| 1 | 1 | 0 | /SD6 | 6 | 7 | 7 | 0 | 0 | 1 | 1 | 2 | 2 | 3 | 3 | 4 | 4 | 5 | 5 |
| 1 | 1 | 1 | /SD7 | 7 | 0 | 0 | 1 | 1 | 2 | 2 | 3 | 3 | 4 | 4 | 5 | 5 | 6 | 6 |

• : CORRESPONDENCE RELATIONSHIP OF /SD AND SWL IS SAME FOR MEMORY BLOCKS

FIG. 12
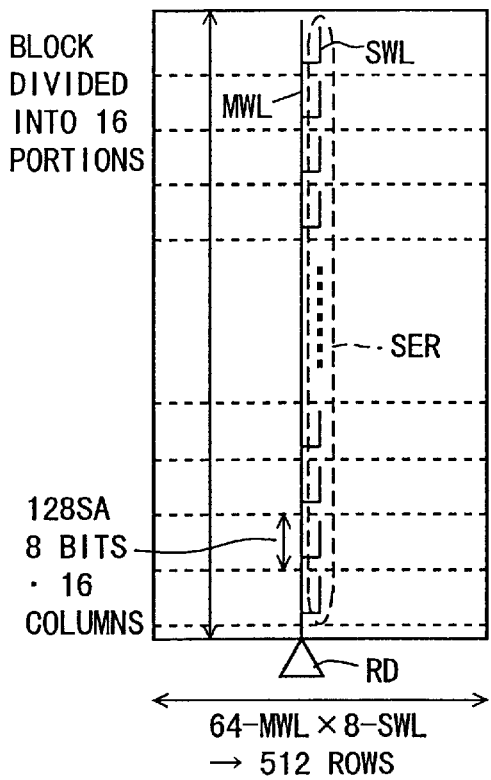
FIG. 13A
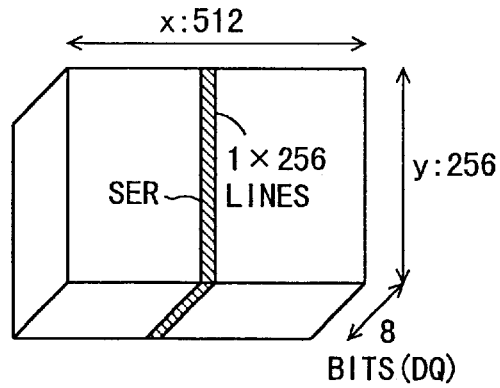
FIG. 13B

BOX MODE

BOX MODE

BOX MODE 1

BOX MODE 2

| SDECO | 1 | 2 | 3 | • • • | 13 | 14 | 15 |
|---|---|---|---|---|---|---|---|
| LM | i | i | i | i | • • • | i | i | i |
| BM1 | i | i+1 | i+2 | i+3 | • • • | i+13 | i+14 | i+15 |
| BM2 | i | i | i+1 | i+1 | • • • | i+6 | i+7 | i+7 |

(i+2)(i+2)         (i+12)(i+14)(i+14)

: ADDITION RELATED TO SYSTEM OF
RESIDUES OF 16 (mod. 16)

SEMICONDUCTOR MEMORY DEVICE FOR FAST ACCESS

BACKGROUND OF THE INVENTION

1. Field of the Invention

The present invention relates to semiconductor memory device and, more particularly to a dynamic semiconductor memory device in which row and column selections are time multiplexedly performed. More specifically, the present invention relates to a dynamic semiconductor memory device used for an image processing application.

2. Description of the Background Art

FIG. 22 is a diagram schematically showing an arrangement of an array portion of a conventional dynamic semiconductor memory device (hereinafter abbreviated as DRAM). A word line WL and bit lines BL and ZBL are shown in FIG. 22. A memory cell MC is arranged corresponding to an intersection of bit line BL and word line WL. Memory cell MC includes a memory cell capacitor MQ for storing information and an access transistor MT for connecting memory cell capacitor MQ to bit line BL in response to a signal on word line WL. A cell plate voltage Vcp is applied to a cell plate node of memory cell capacitor MQ. Electric charges corresponding to the stored information are accumulated in an electrode (a storage node) connected to access transistor MT of memory cell capacitor MQ.

Bit lines BL and ZBL are arranged in a pair for transmitting complementary data signals. Memory cell MC is arranged corresponding to an intersection between one of bit lines BL and ZBL and a word line.

A sense amplifier circuit SA is arranged for bit lines BL and ZBL. Sense amplifier circuit SA differentially amplifies and latches a small voltage read onto bit lines BL and ZBL when activated. Bit lines BL and ZBL are connected to an internal data line pair IOP through a column selection gate CSG that is rendered conductive in response to a column selection signal Y on a column selection line CSL. Internal data line pair IOP is connected to a writing/reading circuit WRK including a write driver and a preamplifier.

FIG. 23 is a diagram showing signal waveforms related to a data access operation of DRAM shown in FIG. 22. The data access operation of the DRAM shown in FIG. 22 will now be described with reference to the signal waveform diagram shown in FIG. 23. Here, in the data access operation, data is written to or read from a memory cell.

Word line WL is selected in accordance with a row access instruction signal, and the voltage level thereof increases. When the voltage of word line WL rises, access transistor MT of memory cell MC is rendered conductive, so that accumulated electric charges of corresponding memory cell capacitor MQ are transmitted to corresponding bit line BL (or ZBL). The voltage level of bit line BL or ZBL changes in accordance with the stored data of the memory cell. FIG. 23 shows signal waveforms when data at an H level is read onto bit line BL.

The memory cell data is read to one of bit lines BL and ZBL, but no memory cell data is read onto the other bit line. The other bit line maintains a precharge voltage level (at an intermediate voltage level).

When the voltage (read voltage) read onto bit line BL (or ZBL) becomes sufficiently large, sense amplifier circuit SA is activated for differentially amplifying the voltages of bit line BL and ZBL. In differential amplification of sense amplifier circuit SA, the voltage of the bit line to which the memory cell data is read is amplified with reference to a potential of the bit line maintained at the precharge voltage. After the sensing operation, sense amplifier circuit SA maintains the voltages of bit lines BL and ZBL at the levels of a power supply voltage and a ground voltage in accordance with the memory cell data. A period till completion of the sensing operation of sense amplifier circuit SA and definition of the potentials of bit lines BL and ZBL is referred to as a column interlock period, during which column selection operation is prohibited.

When the column interlock period is elapsed, external column selection (column access) can be performed. In column access (column selection operation), column selection signal Y is activated in accordance with an applied column address signal, column selection gate CSG is rendered conductive in accordance with column selection signal Y on column selection line CSL, and bit lines BL and ZBL are connected to internal data line pair IOP. In this state, writing/reading circuit WRK is activated. In data writing, a write driver included in writing/reading circuit WRK is activated for setting the potentials of signals latched by sense amplifier circuit SA to voltage levels in according to the write data. In data reading, the signals latched by sense amplifier circuit SA are transmitted through internal data line pair IOP and amplified by the preamplifier included in writing/reading circuit WRK. FIG. 23 depicts signal waveforms in data writing by dotted lines.

In the DRAM, electric charges accumulated in memory cell capacitor MQ are read to corresponding bit line BL (or ZBL), and amplified and latched by sense amplifier circuit SA. Since sense amplifier circuit SA differentially amplifies a small voltage difference between bit lines BL and ZBL, during the sensing operation, column access is prohibited to prevent data destruction. Thus, in the DRAM, row access of selecting a word line and then performing the sensing operation by sense amplifier circuit SA and column access of selecting a column (a bit line pair) in accordance with the column address signal are time division multiplexedly performed. In addition, the amplified voltages of bit lines BL and ZBL are re-written to memory cell MC by the latching operation of sense amplifier circuit SA, so that the destructively read memory cell data is restored.

The DRAM is widely used as a mass storage memory since memory cell MC includes one access transistor MT and one memory cell capacitor MQ so that the silicon real estate of the memory cell is small and a cost per bit is low.

FIG. 24 is a diagram showing an exemplary operation sequence of the DRAM. Referring to FIG. 24, a row access instruction signal RACT and a data reading instruction signal READ are applied. In the case of a standard DRAM, row access instruction signal RACT is applied by the activation of a row address strobe signal /RAS. In the case of a synchronous DRAM (SDRAM or the like) operating in synchronization with a clock signal, the row access instruction signal is applied by active command ACT. In the case of the standard DRAM, reading operation designation signal READ is applied by a column address strobe signal /CAS and a write enable signal /WE (and output enable signal /OE). In the case of the SDRAM, reading operation designation signal READ is applied by a read command.

When row access instruction signal RACT is applied, word line WL is selected. Thereafter, reading operation designation signal READ is applied, and column selection signal Y is driven into a selected state in accordance with a concurrently applied column address. When a prescribed period of time is elapsed after column selection is performed in accordance with reading operation designation signal READ, data Q is externally read. The time required after reading operation designation signal READ is applied and before valid data is externally output is referred to as a CAS access time tCAC in the standard DRAM. On the other hand, the time required after row access instruction signal RACT is applied and before valid data is externally output is referred to as an RAS access time tRAC in the standard DRAM.

Accordingly, to externally output valid data after activation of row access instruction signal RACT, column selection must be performed after row selection and sense amplifier activation are performed. RAS access time tRAC is relatively long. On the other hand, during CAC access time tCAC, a memory cell is merely selected from a row in the selected state for data reading. Specifically, access time tCAC is the time required for data to be output from an output buffer through the reading circuit included in writing/reading circuit WRK from sense amplifier circuit SA, and is relatively short. Accordingly, when memory cell data is read with reading operation designation signal READ being successively applied to the same word line, data can be read at a relatively high speed. Such an operation mode is referred to as a page mode or a static column mode in the standard DRAM. In the SDRAM, when the burst operation is performed, data by burst length are successively read in accordance with an internally generated column address. The page mode operation can be performed also in the SDRAM.

However, when another row is selected, the word line in the selected state is temporarily driven into the non-selected state by applying precharge designation signal PRC, and row access instruction signal RACT must be again applied. Precharge designation signal PRC is applied upon inactivation of row address strobe signal /RAS in the standard DRAM, and applied by a precharge command in the SDRAM or the like.

A time referred to as RAS precharge time tRP is required after the precharge designation signal is applied and before the row access instruction signal is applied next. During the RAS precharge period, a row related circuit is once brought back into a stand-by state. Thus, although fast data access is performed when successively accessing the same row (word line), inactivation of the word line and selection of another word line must be performed in changing rows (page switching), during which data cannot be accessed. Thus, fast data transfer is not achieved.

To cope with the problem related to the decrease in data transfer speed caused by such an operation of the row related circuit, a multibank DRAM or the like has been proposed, in which a cache DRAM with a cache contained in the DRAM and a memory array within a chip are divided into a plurality of banks and a time division multiplexed operation (an interleave operation) is performed every bank.

However, the cache DRAM internally requires an SRAM (a static RAM) arranged as a cache and a control circuit for determination of cache miss/hit as well as for data transfer between the DRAM and the cache based on the determination result. Thus, a chip area increases.

In the case of the multibank DRAM, an overhead in page switching is not caused for successive access to different banks as in the case of time division multiplexed accessing to the banks (this is because a word line is selected in another bank in accessing one bank). However, when accessing a different row in the same bank, the problem associated with the overhead in page switching is caused. To enhance the effect of the multibank configuration and to increase the number of banks so as to minimize the occurrence of successive accesses to the same bank, a sense amplifier circuit group must be provided for each bank. Thus, the area of the memory array increases and the area of the bank control circuit also increases disadvantageously.

SUMMARY OF THE INVENTION

An object of the present invention is to provide a semiconductor memory device capable of reducing an overhead in page switching without increasing a circuit area for increasing data transfer speed.

Another object of the present invention is to provide a semiconductor memory device capable of transferring data at a high speed according to an image data process application.

A semiconductor memory device according to the present invention includes: a memory array having a plurality of memory cells arranged in a matrix of rows and columns and divided into a plurality of memory blocks in a row direction; a plurality of main word lines arranged corresponding to the memory cells of a prescribed number of rows of the memory array and shared by the plurality of memory blocks; a plurality of sub word lines arranged corresponding to respective memory cell rows of each memory block and each connected to the memory cells of a corresponding row; a main word line selection circuit for selecting a main word line of the plurality of main word lines that is arranged corresponding to an addressed row in accordance with a first address signal bit; and a plurality of sub decode circuits arranged corresponding to the memory blocks and each decoding a second address signal bit for generating a sub word line designation signal designating one of the prescribed number of rows in accordance with the decode result. Each of the sub decode circuits includes a changing circuit for changing a correspondence relationship between the decode signal and the sub word line designation signal in accordance with a page geometry designation signal.

The semiconductor memory device according to the present invention further includes a plurality of sub word line drive circuits arranged corresponding to respective sub word lines for driving the corresponding sub word lines into a selected state in accordance with the sub word line designation signal and signals on corresponding main word lines.

A semiconductor memory device according to another aspect of the present invention includes: a memory array having a plurality of memory cells arranged in a matrix of rows and columns and divided into a plurality of memory blocks in a row direction; and a plurality of main word lines each shared by the plurality of memory blocks and arranged corresponding to a prescribed number of rows of the memory array. Each of the plurality of main word lines includes first and second word lines transmitting complementary signals.

A semiconductor memory device according to another aspect of the present invention further includes; a plurality of sub decode circuits arranged corresponding to each memory block for generating a sub decode signal designating one of the prescribed number of rows of a corresponding memory block in accordance with a first address bit; a plurality of sub word lines arranged corresponding to respective rows of the memory blocks and each connected to memory cells of a corresponding row; and a plurality of sub word line drive circuits arranged corresponding to respective sub word lines, each for driving a corresponding sub word line into a selected state in accordance with a corresponding sub decode signal and signals on the first and second word lines of a corresponding main word line.

By changing a correspondence relationship between an address bit (a decode signal) and the sub word line selection signal every memory block in accordance with a page geometry designation signal, a sub word line to be driven into the selected state can be changed every memory block. Accordingly, different rows can be successively accessed after accessing one row, so that the number of row accesses can be reduced for higher data transfer speed.

Further, since the sub decode signal is provided every memory block and the main word line includes complementary word line pair, a configuration capable of changing a pattern of the sub word lines selected every memory block can be achieved without increasing an interconnection line region.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a diagram representing allocation of physical column addresses of a semiconductor memory device according to the present invention.

FIG. 13A is a diagram showing positions of selected sub word lines in a line mode, and FIG. 13B is a diagram showing a region of a selected memory cell in a logic address space in the line mode.

DESCRIPTION OF THE PREFERRED EMBODIMENTS

First Embodiment

Figure 1:
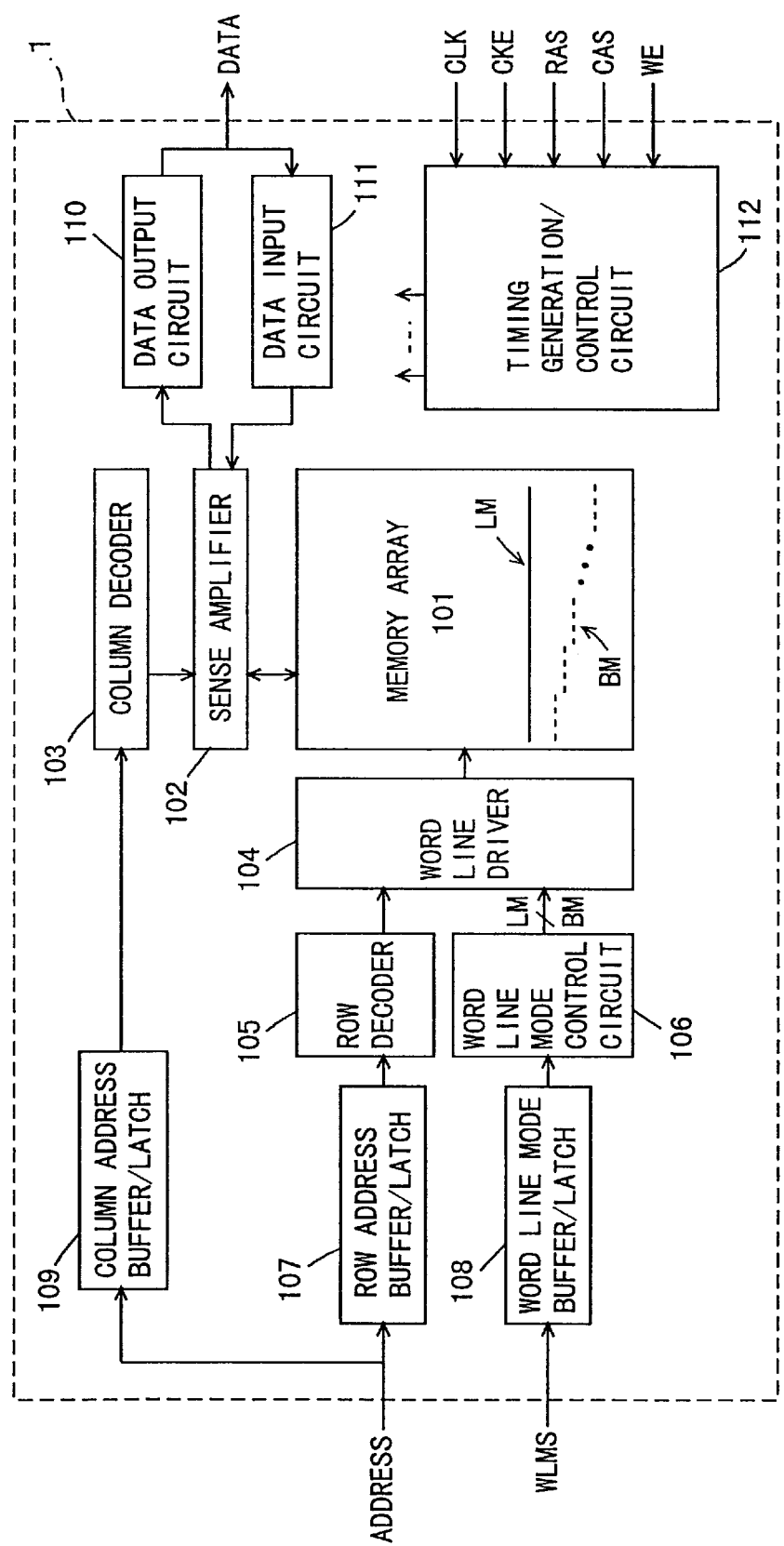
FIG. 1 is a diagram schematically showing an overall arrangement of a semiconductor memory device according to a first embodiment of the present invention.

FIG. 1 is a diagram schematically showing an overall arrangement of a semiconductor memory device according to a first embodiment of the present invention. Referring to FIG. 1, a semiconductor memory device 1 includes: a memory array 101 having a plurality of memory cells arranged in a matrix of rows and columns; and a timing generation/control circuit 112 incorporating external control signals CKE, RAS, CAS, and WE in synchronization with an externally applied clock signal CLK for generating an internal operation control signal in accordance with a combination of logical levels of the incorporated control signals.

Semiconductor memory device 1 is a clock synchronous semiconductor memory device for transferring data DATA in synchronization with externally applied clock signal CLK. Control signal CKE is a clock enable signal. When control signal CKE is in an active state, timing generation/control circuit 112 generates various internal operation control signals in synchronization with clock signal CLK. An operation mode is designated in accordance with a combination of logical levels of control signals RAS, CAS, and WE at a rising edge of clock signal CLK, for example. Timing generation/control circuit 112 may be supplied with a specific address bit, and an operation mode may be designated in further combination with the address bit.

Semiconductor memory device 1 further includes: a row address buffer/latch 107 incorporating and latching an externally applied address under control of timing generation/ control circuit 112 for generating an internal row address signal; a row decoder 105 operating under control of timing generation/control circuit 112 for decoding the internal row address signal received from row address buffer/latch 107; a word line mode buffer/latch 108 latching an externally applied word line mode designation signal WLMS; a word line mode control circuit 106 generating a word line mode designation signal in accordance with a timing control signal from timing generation/control circuit 112 and word line mode designation signal WLMS from word line mode buffer/latch 108; and a word line driver 104 for selecting a row of memory array 101 in accordance with a decode signal from row decoder 105 and word line mode designation signals LM, BM from word line mode control circuit 106.

When one row corresponds to one page, word line mode designation signal WLMS applied to the word line mode buffer/latch includes a line mode designation signal LM designating a line mode LM selecting the memory cells corresponding to a full page, and a box mode designation signal BM partially selecting different pages and simultaneously selecting a region corresponding to a rectangular region, for example, on a display screen. Here, the "one row" refers to a row of memory cells arranged corresponding to pixels on a common scanning line on a display screen, for example. When the line mode is designated, the memory cells of one row are selected as shown by a solid line in memory array 101. When box mode BM is designated, different rows (word lines) are simultaneously selected as shown by dotted lines in memory array 101. In the box mode and the line mode, the number of memory cells selected simultaneously is the same. In the application of a graphics process, for example, the word line selection mode is designated according to the processing contents.

Semiconductor memory device 1 further includes: a column address buffer/latch 109 operating under control of timing generation/control circuit 112 for incorporating and latching an externally applied address signal for generating an internal column address signal; a column decoder 103 operating under control of timing generation/control circuit 112 for decoding the internal column address signal from column address buffer/latch 109 and generating a column selection signal; and a sense amplifier 102 activated under control of timing generation/control circuit 112 for sensing, amplifying and latching data of memory cells connected to a selected row of memory array 101. Sense amplifier 102 includes both of a sense amplifier circuit arranged corresponding to each column of memory array 101 and a column selection gate connecting a selected column to an internal data line in accordance with the column selection signal from column decoder 103.

A data output circuit 110 and a data input circuit 111 are arranged for data transfer with a selected memory cell in memory array 101 through a column selection gate included in sense amplifier 102. Data output circuit 110 is activated in a data reading mode, i.e., when a read command is applied, for reading out memory cell data latched by the sense amplifier circuit of sense amplifier 102 in synchronization with clock signal CLK and generating read out data. When a write command is applied and data writing is designated, data input circuit 111 incorporates externally applied data DATA in synchronization with clock signal CLK for transmission to a selected memory cell in memory array 101 through the column selection gate included in sense amplifier 102.

By utilizing box mode BM, different rows are simultaneously driven into the selected state, so that successive column addressing and access to different rows are performed in page switching. Thus, the overhead in page switching is eliminated for fast data transfer.

Figure 2:
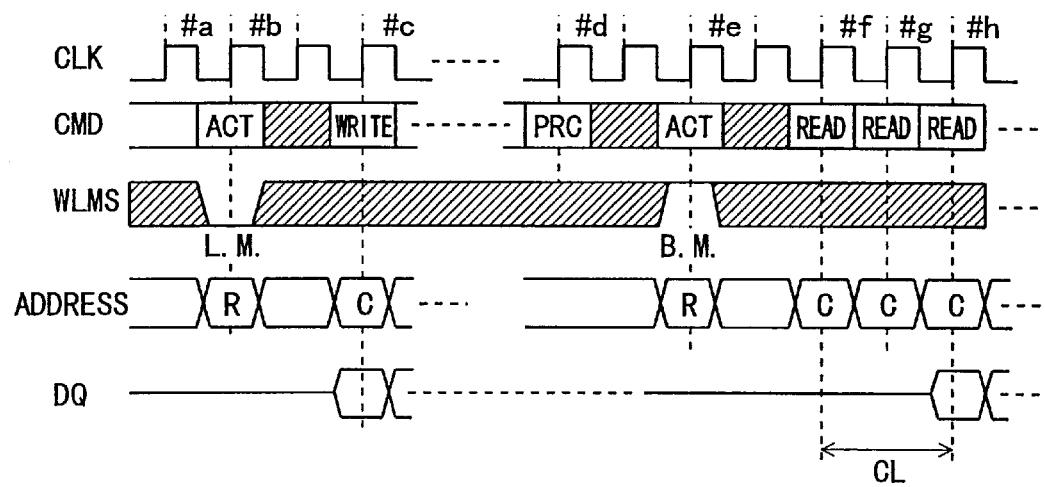
FIG. 2 is a timing chart showing an operation sequence of the semiconductor memory device shown in FIG. 1.

FIG. 2 is a diagram showing an exemplary operation sequence of the semiconductor memory device shown in FIG. 1. As shown in FIG. 2, the semiconductor memory device operates in synchronization with clock signal CLK. Although a chip interface is similar to that of an SDRAM (a synchronous DRAM), a word line mode designation signal WLMS for designating a word line selection mode is used. Word line selection mode designation signal WLMS is incorporated and latched by word line mode buffer/latch 108 when an active command designating a row access is applied.

Referring to FIG. 2, a command CMD is represented by a combination of logical levels of control signals RAS, CAS, and WE shown in FIG. 1. Command CMD, address, and write data are incorporated in synchronization with the rising edge of clock signal CLK. In a clock cycle #a, an active command ACT is applied, and word line mode designation signal WLMS is set at an L level for designating a line mode (L.M.). At the start of a clock cycle #b, these signals are incorporated at the rising edge of clock signal CLK and an internal operation is performed. When active command ACT is applied, row access is designated. Thus, row related circuitry including row decoder 105, word line driver 104, sense amplifier 102 and the like related to row selection, operates. At the rising edge of clock signal CK in clock cycle #b, an externally applied address is incorporated as a row address R, and an internal row address signal is generated by row address buffer/latch 107 and applied to row decoder 105.

After active command ACT is applied in clock cycle #b, a write command WRITE designating data writing is applied in the next clock cycle #c. When write command WRITE is applied, an address applied at the time is incorporated as a column address C by column address buffer/latch 109 and an internal column address signal is generated. Further, the data input circuit and column decoder 103 operate under control of timing generation/control circuit 112, and data is incorporated at the rising edge of clock signal CLK and applied to data input circuit 111. The incorporated data is written to a selected memory cell in a prescribed sequence.

When data writing is completed, a precharge command PRC is applied in a clock cycle #d, semiconductor memory device 1 is brought into a precharge state, and the selected word line of memory array 101 is driven into a non-selected state.

When a so-called RAS precharge time is elapsed, active command ACT is again applied in a clock cycle #e. Simultaneously, word line mode designation signal WLMS is set at an H level to designate a box mode (B. M.). In clock cycle #e, a row selection operation is performed with row address R that has been applied simultaneously with active command ACT. In the box mode, different rows are selected at the same time in memory array 101. Accordingly, read command READ designating data reading is applied in clock cycles #f, #g and #h and column address C is concurrently applied, so that data of the memory cells in different rows are successively read. Here, FIG. 2 shows a data reading operation sequence where column latency CL, which is a period required after application of read command READ and before output of data, is 2.

By simultaneously applying word line mode designation signal WLMS and active command ACT externally and changing a word line selecting manner, a page geometry can easily be changed according to a process content.

Figure 3A:
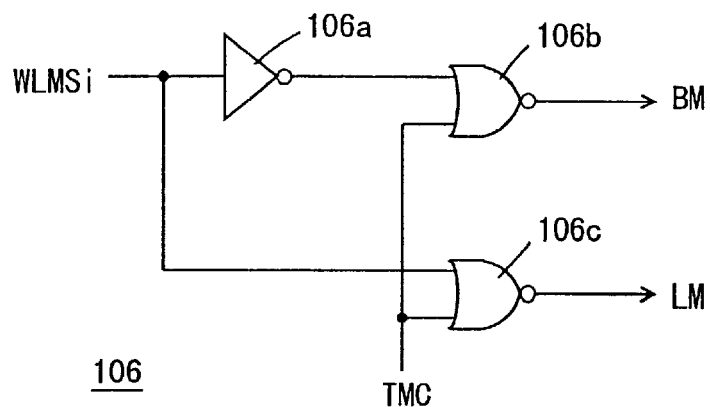
FIG. 3A is a diagram showing an arrangement of a word line mode control circuit shown in FIG. 1.
Figure 3B:
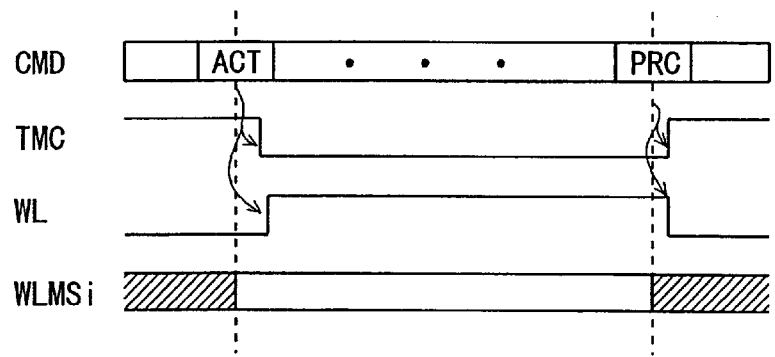
FIG. 3B is a timing chart representing an operation of the word line mode control circuit.

FIG. 3A is a diagram showing an exemplary arrangement of word line mode control circuit 106 shown in FIG. 1. Referring to FIG. 3A, word line mode control circuit 106 includes: an inverter 106a receiving an internal word line mode designation signal WLMSi from word line mode buffer/latch 108; an NOR circuit 106b receiving an output signal from inverter 106a and a timing control signal TMC for generating a box mode designation signal BM; and an NOR circuit 106c receiving internal word line mode designation signal WLMSi from word line mode buffer/latch 108 and timing control signal TMC for generating line mode designation signal LM. Now, the operation of word line mode control circuit 106 shown in FIG. 3A will be described with reference to a timing chart shown in FIG. 3B.

In a stand-by mode (a precharge state), timing control signal TMC is at the H level. Box mode designation signal BM and line mode designation signal LM, respectively output from NOR circuits 106b and 106c, are both at the L level.

Timing control signal TMC attains to the L level when active command ACT is applied, and NOR circuits 106b and 106c operate as an inverter. Upon application of active command ACT, simultaneously, the state of word line mode designation signal WLMS is determined and internal word line mode designation signal WLMSi from word line mode buffer/latch 108 is fixed at the H or L level. One of box mode designation signal BM and line mode designation signal LM is driven into the active state of the H level in accordance with the level (H or L) of word line mode designation signal WLMS (WLMSi). When the line mode is designated, word line mode designation signal WLMS is at the L level. Accordingly, line mode designation signal LM from NOR circuit 106c is at the H level, and box mode designation signal BM from NOR circuit 106b is at the L level. Conversely, when the box mode is designated, word line mode designation signal WLMS is at the H level, box mode designation signal BN is at the H level, and line mode designation signal LM from NOR circuit 106c is maintained at the L level.

After one of box mode designation signal BM and line mode designation signal LM is activated, word line(s) WL is(are) driven into the selected state in accordance with the designated word line selection mode.

Timing control signal TMC and selected word line WL are maintained in that state until precharge command PRC is applied. When precharge command PRC is applied, timing control signal TMC is brought into the inactive state of the H level, and line mode designation signal LM and box mode designation signal BM both attain to the L level. In addition, the selected word line(s) is(are) driven into the non-selected state by precharge command PRC.

Timing control signal TMC can be generated, for example, by using a set/reset flip flop which is set when a prescribed period of time is elapsed in response to activation of active command ACT and reset in response to application of precharge command PRC. Further, a row decoder enable signal (RADE) may be used as timing control signal TMC for enabling, for example, row decoder 106.

Figure 4:
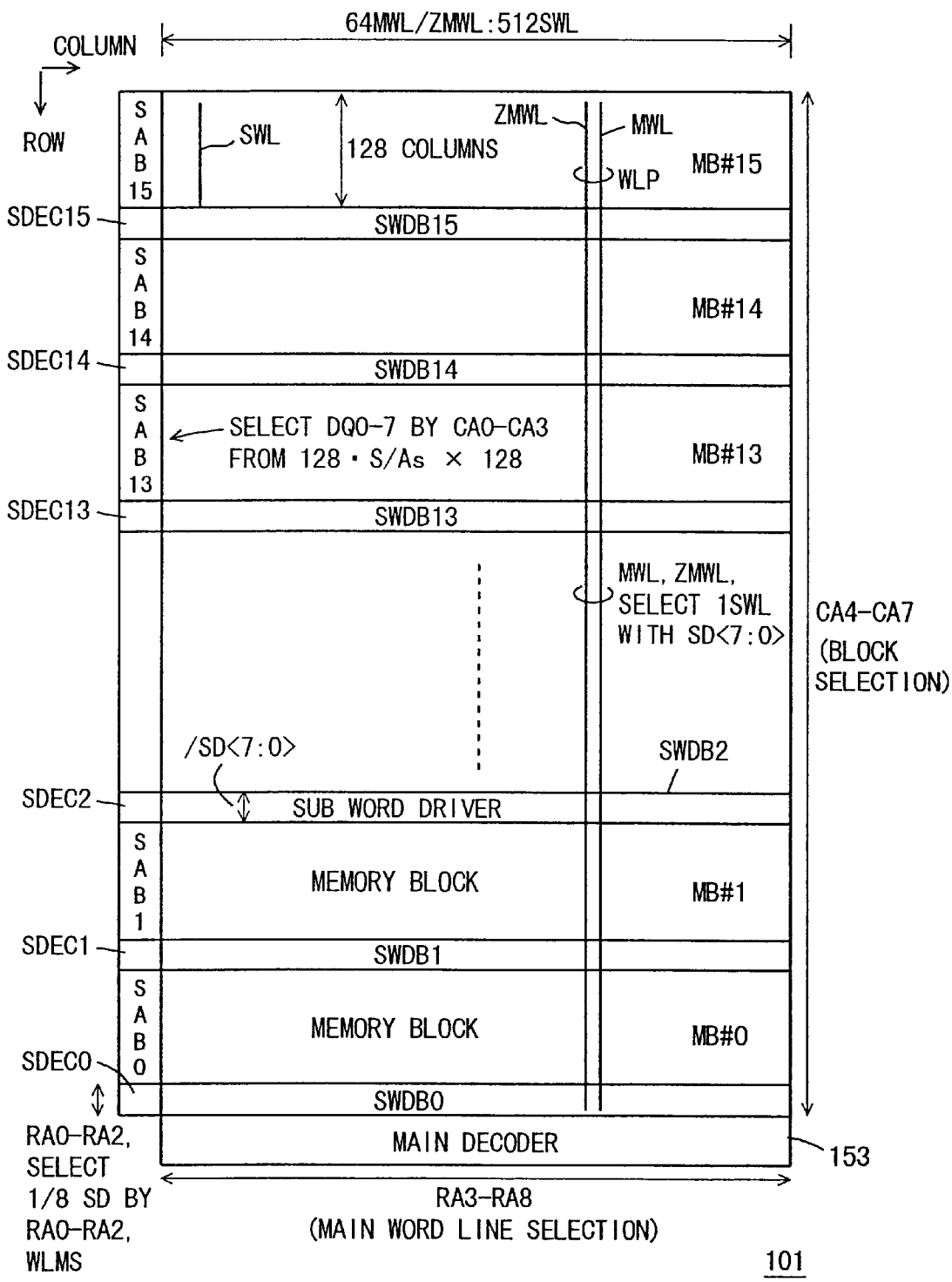
FIG. 4 is a diagram schematically showing a configuration of a memory array portion of the semiconductor memory device shown in FIG. 1.

FIG. 4 is a diagram schematically showing a configuration of memory array 101. Referring to FIG. 4, memory array 101 is divided into 16 memory blocks MB#0–MB#15 in a row direction. A main decoder 153 for selecting a main word line is arranged being shared by memory blocks MB#0–MB#15. A main word line selection signal from main decoder 135 is transmitted through main word line pair WLP arranged in the row direction over memory blocks MB#0–MB#15 and shared thereby. Main word line pair WLP includes main word lines MWL and ZMWL. Complementary main word line selection signals are transmitted to main word lines MWL and ZMWL.

In each of memory blocks MB#0–MB#15, sub word line SWL is arranged corresponding to a memory cell row, and is connected to memory cells of a corresponding row of the corresponding memory block. For example, main decoder 153 decodes 6-bit addresses RA8–RA3 and selects one of 64 main word line pairs WLP. In each of memory blocks MB#0–MB#15, 512 sub word lines SWL are arranged, 8 sub word lines SWL being arranged for one main word line pair WLP.

Sub word line driver bands SWDB0–SWDB15 are arranged corresponding to each of memory blocks MB#0–MB#15. These sub word line driver bands SWDB0–SWDB15 correspond to word line driver 104 shown in FIG. 1, and are distributed corresponding to respective memory blocks in the memory array. Sub word line drive circuits are arranged corresponding to respective sub word lines SWL in these sub word driver bands SWDB0–SWDB15.

Further, sense amplifier bands SAB0–SAB15 are arranged corresponding to memory blocks MB#0–MB#15. Each of sense amplifier bands SAB0–SAB15 includes 128 sense amplifier circuits SA. More specifically, each of memory blocks MB#0–MB#15 includes memory cells arranged in 512 rows by 128 columns. The sense amplifier circuits of these sense amplifier bands SAB0–SAB15 are simultaneously activated.

Sub decoder bands SEDC0–SDEC15 are arranged corresponding to the intersections of sense amplifier bands SAB0–SAB15 and sub word line driver bands SWDB0–SWDB15. Each of sub decoder bands SDEC0–SDEC15 includes 8 sub decoder circuits and, one of sub decode signals applied to the sub word driver band of an associated memory block is activated in accordance with row address bits RA2–RA0 and word line mode designation signal WLMS.

One of signals /SD7–/SD0 transmitted to sub word line driver band SWDB is activated, and one of 8 sub word lines SWL arranged corresponding to one main word line pair WLP is selected. Since the main word lines are each complementary signal line pair, 8 sub decode signal transmission lines can be arranged for each of sub word line driver bands SWDB0–SWDB15 without causing any increase in the interconnection area (not utilizing complementary sub decode signal pair). One main word line is arranged for 4 sub word lines SWL, so that the main word lines can be arranged with a margin.

In the memory array configuration, main decoder 153 selects one of 64 main word line pairs WLP by row address bits RA8–RA3. On the other hand, in sub decoder bands SEDC0–SDEC15, one of 8 sub decode signal transmission lines is driven into the selected state in accordance with row address bits RA2–RA3 and word line mode designation signal WLMS. Accordingly, even when the same main word line pair is selected, a different sub word line can be selected for a different memory block by word line mode designation signal WLMS.

For data accessing, one of 16 memory blocks MB#0–MB#15 is selected by column address bits CA7–CA4. In the selected memory block, selection on 128 sense amplifier circuits SA is performed by 4-bit column address bits CA3–CA0. Thus, 8 sense amplifier circuits SA are selected by column address bits CA3–CA0, and 8-bit data DQ0–DQ7 can be written/read (data access).

Figures 5A, 5B:
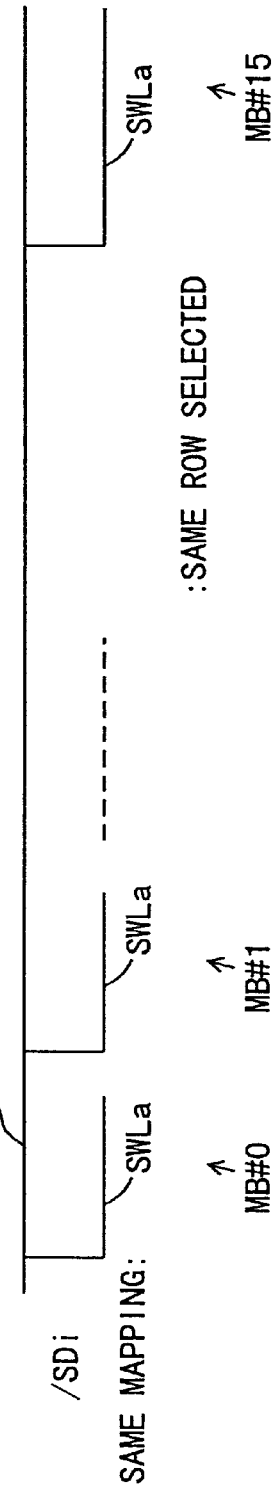
FIG. 5A is a diagram showing a distribution of sub decode signals activated in a line mode.
FIG. 5B is a diagram showing positions of the sub word lines selected in the line mode.

FIG. 5A is a table showing a correspondence relationship between a sub decode signal /SD activated in a line mode and row address bits. Row address bits X0–X2 are internal row address bits generated through buffering on external row address bits RA0–RA2. In sub decoder bands SEDC0–SDEC15, 8 sub decode signals /SD0–/SD7 are generated and transmitted to respective sub word driver bands. The correspondence relationship between row address bits X2–X0 and sub decode signals /SD0–/SD7 in sub decoder bands SEDC0–SDEC15 are all the same. One of 8 sub decode signals /SD0–/SD7 is activated by 3-bit row address X2–X0. For example, when all of row address bits X2–X0 are "0", sub decode signal /SD0 is activated in sub decoder bands SEDC0–SDEC15. Note that FIG. 5A shows only numbers of the sub decode signals in sub decoder bands SDEC1–SDEC15 for simplification.

Thus, referring to FIG. 5B, sub word lines SWLa which are in the same positional correspondence relationship with respect to main word line pair WLP are selected in memory blocks MB#0–MB#15. In memory blocks MB#0–MB#15, the correspondence relationship between sub decode signals /SD0–/SD7 and the sub word lines are uniquely determined (this win later be described in detail). Accordingly, in reading for display of or input for buffering of a raster-scanned video signal scanned in a horizontal direction, through successive accessing with one main word line pair WLP being one page, pixel data can be transferred and processed with a so-called horizontal scanning line correlated to the one page.

Figures 6A, 6B:
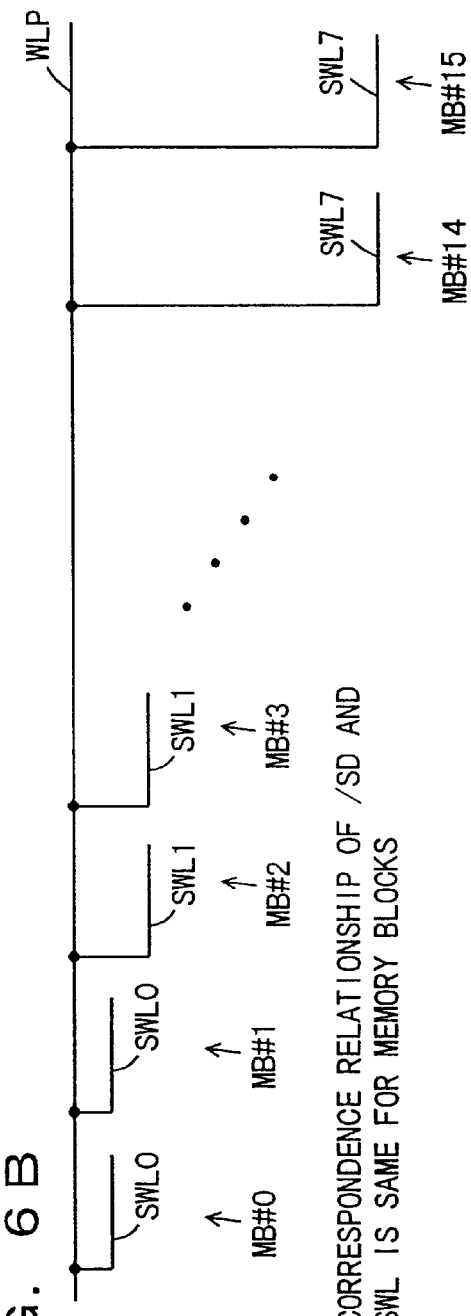
FIG. 6A is a diagram showing a distribution of sub decode signals activated in a box mode.
FIG. 6B is a diagram showing positions of selected sub word lines in the box mode.

FIG. 6A is a table showing a correspondence relationship between sub decode signals /SD activated in the box mode and row address bits X0–X2. FIG. 6A also shows only numbers of the activated sub decode signals in sub decoder bands SDEC1–SDEC15. As shown in FIG. 6A, in the box mode, different sub decode signals are activated every two sub decoder bands. In every adjacent two sub decoder bands, the position of the activated sub decode signal is shifted toward the position with a number greater by one (shifted in a cyclic manner). Accordingly, when the row address bits are applied, a sub word line in the next row is selected every two memory blocks. For example, when all of row address bits X0–X2 are "0", sub decode signal /SD0 is activated in sub decoder bands SDEC0 and SDEC1. In sub decoder bands SDEC2 and SDEC3, sub decode signal /SD1 is activated. Similarly, sub decode signal /SD2 is activated in sub decoder bands SDEC4 and SDEC5. Thus, the number of the sub decode signal to be activated increases sequentially. In sub decoder bands SDEC14 and SDEC15, sub decode signal /SD7 is activated.

FIG. 6B shows selected sub word lines when row address bits X0–X2 are "0". Referring to FIG. 6B, when main word line pair WLP is selected, sub word line SWL0 is selected in memory blocks MB#0 and MB#1, and sub word line SWL1 is selected in memory blocks MB#2 and MB#3. Sub word line SWLi is selected in memory blocks MB#2$i$ and MB#2$i$+1. Here, i=1 to 6. Ultimately, sub word line SWL7 is selected in memory blocks MB#14 and MB#15.

If column addresses of memory cells connected to sub word lines SWL0 and SWL1 are the same in a logical address space, the memory cells at different row addresses and at the same column address are simultaneously selected. More specifically, such state is the same as the case where the memory cells arranged in a rectangular region are simultaneously selected. The selection of the memory cell data in the rectangular region is, for example, performed in the following process. For example, in a graphic process, a process is performed with 8 pixels by 8 pixels used as a unit in DCT (Discrete Cosine Transformation) or the like. Accordingly, by sequentially accessing different rows, pixel data of 8 rows are successively read with the main word line maintained in the active state. Thus, the overhead in page switching is eliminated for successive fast data transfer.

Figure 7:
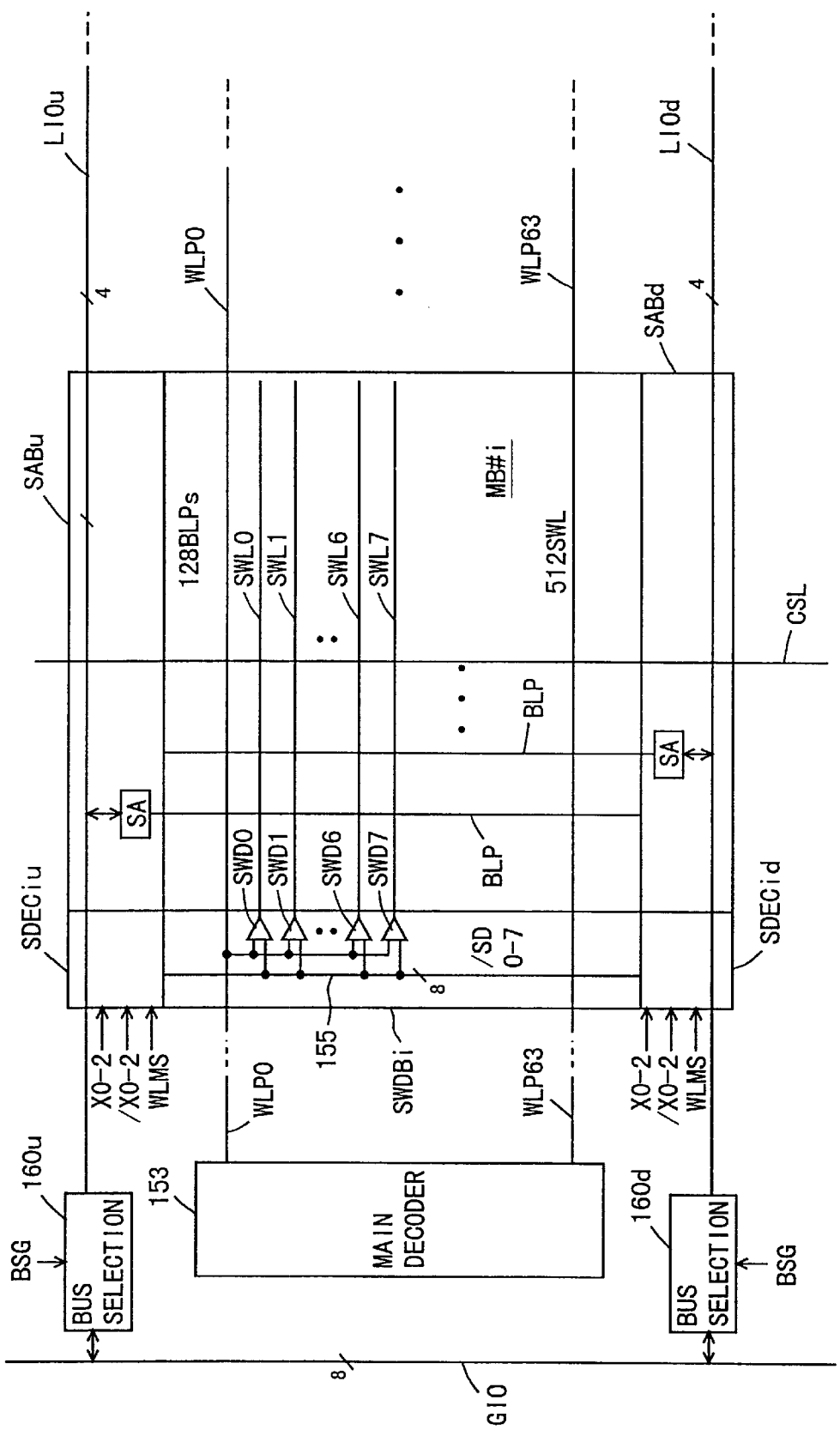
FIG. 7 is a diagram schematically showing a configuration of a memory block.

FIG. 7 is a diagram schematically showing an arrangement of the portion related to one memory block MB#i. Over memory blocks MB#i (i=0 to 15), main word line selection signals are transmitted from main decoder 153. Main word line pairs WLP0–WLP63 are arranged. Main word line pairs WLP0–WLP63 extending from main decoder 153 are shared by memory blocks MB#0–MB#15.

In memory block MB#i, 8 sub word lines SWL0–SWL7 are arranged for one main word line pair WLP (WLP0–WLP63). Bit line pair BLP is arranged in a direction crossing sub word line SWL. Sense amplifier bands SABu and SABd are arranged on either side of memory block MB#i. In sense amplifier bands SABu and SABd, sense amplifier circuits SA are arranged for every other bit line pair BLP. A pitch condition of sense amplifier circuits SA can be alleviated by employing an alternately arranged sense amplifier configuration.

Sub decoder bands SDECiu and SDECid are arranged adjacent to sense amplifier bands SABu and SABd. Each of these sub decoder bands SDECiu and SDECid generates sub decode signals /SD0–/SD7 in accordance with internal row address bits X0–X2 and /X0–/X2 as well as word line mode designation signal WLMS. Sub decoder bands SDECiu and SDECid are separately arranged to independently generate even-numbered sub decode signals and odd-numbered sub decode signals of 8-bit sub decode signals /SD0–/SD7 and to alleviate the pitch condition of the sub decoder circuits included in the sub decoder bands. Sub decode signals /SD0–/SD7 are transmitted over 8-bit sub word selection line 155 extending in a column direction. Sub word selection line 155 is arranged in sub word driver band SWDBi.

In sub word driver band SWDBi, sub word drive circuits SWD0–SWD7 are arranged corresponding to respective sub word lines SWL0–SWL7. For these sub word drivers SWD0–SWD7, 512 sub word lines SWL are arranged in memory block MB#i, so that 512 sub word drive circuits SWD are arranged. Eight sub word drivers SWD0–SWD7 are arranged for one main word line pair, and the sub word lines each are driven into the selected state in accordance with a signal on a corresponding main word line pair WLP and a corresponding sub decode signal /SD.

Local IO buses LIOu and LIOd shared by memory blocks MB#0–MB#15 are arranged extending in the row direction over sense amplifier bands SABu and SABd as well as sub decoder bands SDECiu and SDECid. Each of local IO buses LIOu and LIOd has a 4-bit width. Four sense amplifier circuits (4 bit line pairs) are selected in each of sense amplifier bands SABu and SABd in accordance with a column selection signal on column selection line CSL, and 8-bit memory cells are selected in total. Local IO buses LIOu and LIOd are connected to a global data bus GIO through bus selection circuits 160$u$ and 160$d$.

Bus selection circuits 160$u$ and 160$d$ connect respective local IO buses LIOu and LIOd to global data bus GIO in response to bus selection signal BSG. Bus selection circuits 160$u$ and 160$d$ are provided for the following reason. The memory sub array including memory blocks MB#0–MB#15 has a storage capacity of 128·16·512=1 Mbit, and a plurality of sub arrays are arranged to achieve the required storage capacity. One memory sub array is selected in row or column accessing and connected to global data bus GIO.

Even when a plurality of memory sub arrays are arranged, column selection line CSL is shared by a plurality of memory sub arrays (a column decoder is shared by a plurality of memory sub arrays).

When the semiconductor memory device has a multibank structure with a plurality of banks, block selection signal BSG is activated in column accessing. If the semiconductor memory device has a non-multibank structure including only one bank, bus selection circuits 160u and 160d may connect local IO bus LIO to global data bus GIO in accordance with a sub array designation signal designating a sub array in row accessing. They may also latch a sub array selection signal and connect local IO bus LIO to global data bus GIO in column accessing. This is appropriately determined in accordance with the structure of the memory. Further, sense amplifier bands SABu and SABd may have a shared sense amplifier structure in which the sense amplifier band is shared by adjacent memory sub arrays. The present invention may be applied to the shared sense amplifier structure to provide a similar effect.

Figure 8:
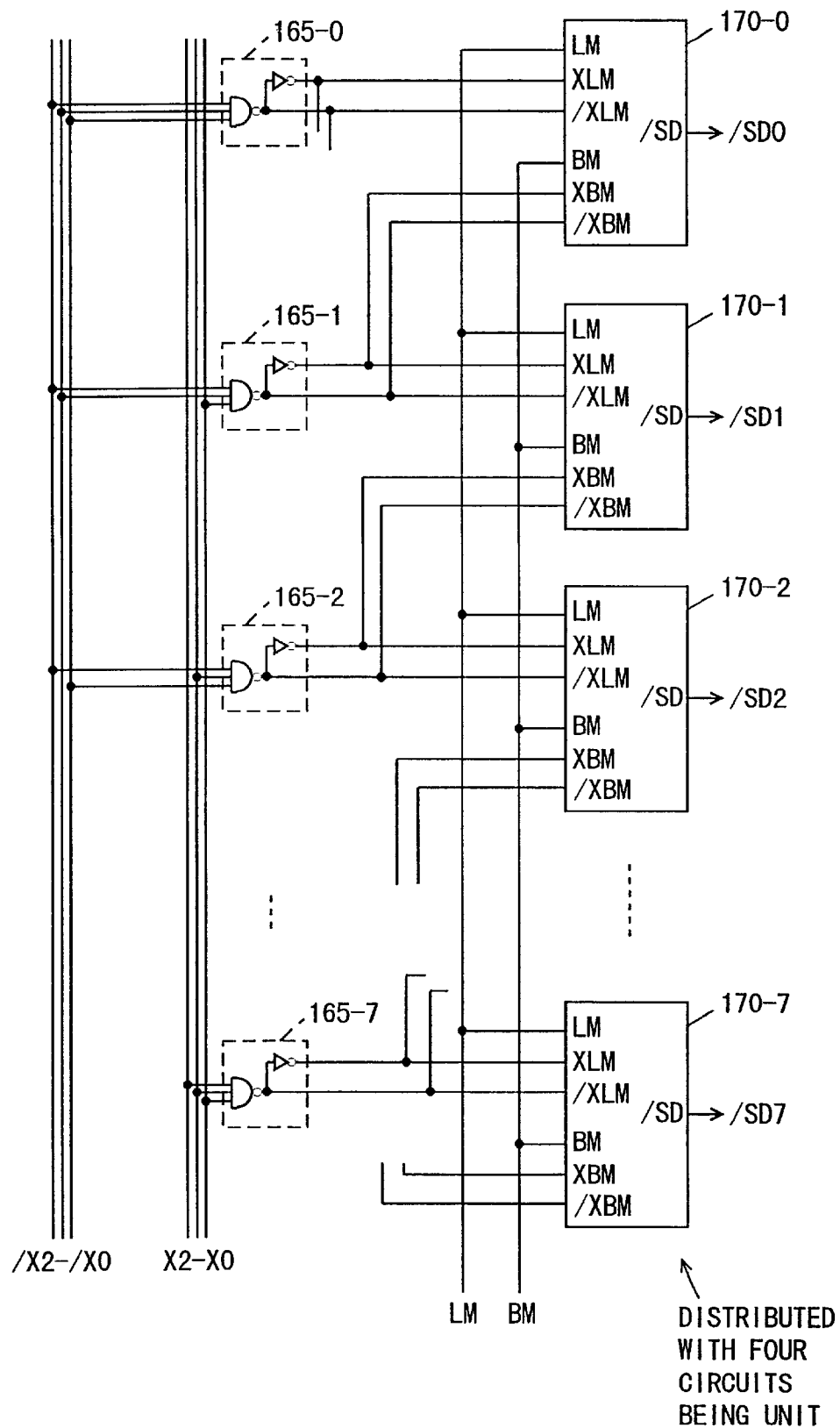
FIG. 8 is a diagram schematically showing a configuration of a sub decoder band shown in FIG. 4.

FIG. 8 is a diagram schematically showing a configuration of one sub decoder band SDEC shown in FIG. 4. FIG. 8 shows 8 sub decode circuits 170-0 to 170-7. Odd-numbered sub decode circuits of these 8 sub decode circuits 170-0 to 170-7 are arranged in sub decoder band SDECiu or SDECid shown in FIG. 7, whereas even-numbered sub decode circuits are arranged in the other sub decoder band. Sub decode signals /SD0–/SD7 are generated by sub decode circuits 170-0 to 170-7 and transmitted onto sub word selection line 155.

Local decode circuits 165-0 to 165-7 are arranged corresponding to sub decode circuits 170-0 to 170-7 for decoding complementary address bits X2–X0 and /X2–/X0. Each of local decode circuits 165-0 to 165-7 is 3-bit address decoder and generates complementary decode signals. A decode signal output from each of local decode circuits 165-0 to 165-7 is basically applied to two sub decode circuits. Note that the sub decode circuits of sub decoder bands SDEC0 and SDEC1 receive the output signals from the same local decode circuit, as shown in FIG. 5A. This is because the same sub word line is selected in both of the line and the box modes in memory blocks MB#0 and MB#1.

Sub decode circuits 170-0 to 170-7 have the same structure each receiving line mode designation signal LM and box mode designation signal BM and including input nodes XLM and /XLM receiving complementary address bits from corresponding local decode circuits as well as input nodes XB and /XBM receiving predetermined decode signals of local decode circuit. When the line mode is designated, line mode designation signal LM attains to the H level, and sub decode signal /SDi is generated in accordance with the complementary decode signals applied to input nodes XLM and /XLM. On the other hand, when the box mode is designated, box mode designation signal BM attains to the H level, and sub decode signal /SDi is generated in accordance with the decode signals applied to input nodes XBM and /XBM.

As the decode signals are selected in accordance with box mode designation signal BM and line mode designation signal LM in sub decode circuits 170-0 to 170-7, the position of the sub word line to be selected can readily be changed in accordance with each word line selection mode. The connection of local decode circuits 165-0 to 165-7 and the inputs of sub decode circuits 170-0 to 170-7 can be changed in accordance with the position of the sub decoder band. The interconnection enables sub word line selection in line and box modes as shown respectively in FIG. 5A and FIG. 6A.

Figure 9:
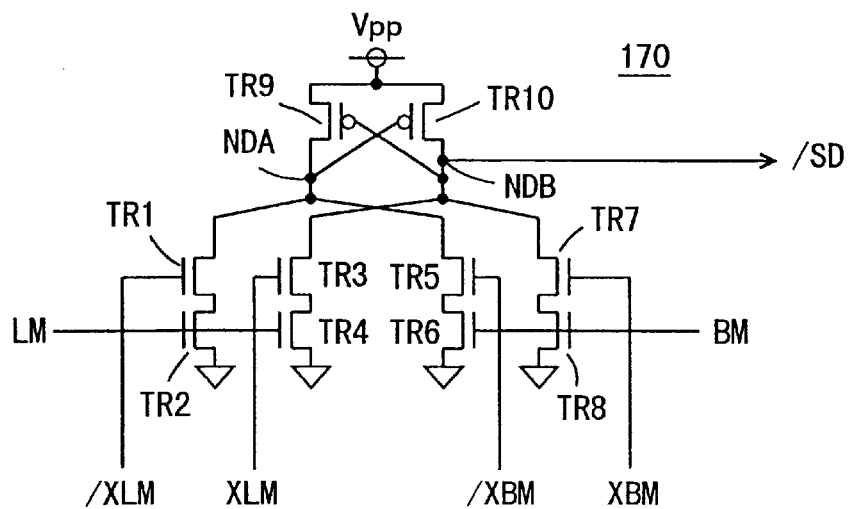
FIG. 9 is a diagram schematically showing an arrangement of a sub decode signal generation circuit shown in FIG. 8.

FIG. 9 is a diagram showing an arrangement of sub decode circuits 170 (170-0 to 170-7) shown in FIG. 8. Referring to FIG. 9, sub decode circuit 170 includes: N channel MOS transistors (insulated gate type field effect transistors) TR2 and TR1 connected in series between a node NDA and a ground node and having their gates receiving line mode designation signal LM and an address bit of node /XLM respectively; N channel MOS transistors TR4 and TR3 connected in series between a node NDB and the ground node and having their gates receiving line mode designation signal LM and a decode signal applied to node XLM respectively; N channel MOS transistors TR6 and TR5 connected in series between node NDA and the ground node and having their gates receiving box mode designation signal BM and a decode signal of node /XBM respectively; and N channel MOS transistors TR8 and TR7 connected in series between node NDB and the ground node and having their gates receiving box mode designation signal BM and a decode signal applied to node XBM respectively.

When line mode designation signal LM is at the H level, MOS transistors TR2 and TR4 are turned on, and one of nodes NDA and NDB is driven and attains to a ground voltage level by MOS transistors TR1 and TR3 in accordance with decode signals applied to nodes /XLM and XLM. When box mode designation signal BM is at the H level, MOS transistors TR6 and TR8 are turned on, and one of nodes NDA and NDB is discharged to attain to the ground voltage level in accordance with decode signals applied to input nodes /XBM and XBM. One pair of the decode signals applied to input nodes XLM, /XLM and XBM, /XBM is selected by line mode designation signal LM and box mode designation signal BM.

Sub decode circuit 170 further includes: a P channel MOS transistor TR9 connected between node NDA and a high voltage node and having its gate connected to node NDB; and a P channel MOS transistor TR10 connected between the high voltage node and node NDB and having its gate connected to node NDA. A sub decode signal /SD is output from node NDB. MOS transistors TR9 and TR10 form a latch type differential amplifier for converting the level of the decode signal at a peripheral power supply voltage level and generating a sub decode signal /SD at high voltage Vpp level. More specifically, sub decode circuit 170 is also provided with a function of converting the decode signal from local decode circuit 165 at the amplitude of peripheral power supply voltage level to a sub decode signal at amplitude of Vpp level. For example, if node NDB attains to the low level, MOS transistor TR9 is turned on to increase the voltage level of node NDA and to drive MOS transistor TR10 into an off state. Accordingly, when the voltage level of node NDB decreases, node NDA is driven to attain to the high voltage Vpp level at high speed and, responsively, MOS transistor TR10 is turned off so that node NDB is discharged to attain to the ground voltage level at high speed. Conversely, node NDB is driven to and attains to the high voltage Vpp level.

Figure 10:
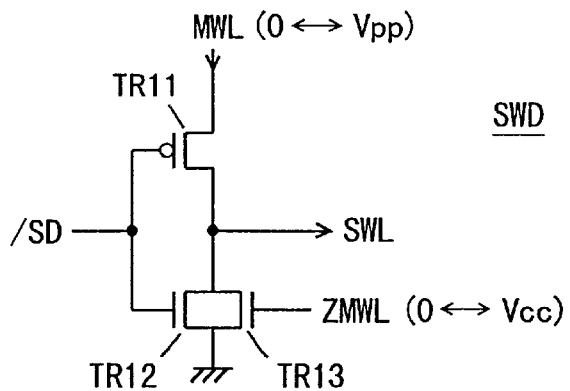
FIG. 10 is a diagram schematically showing an arrangement of a sub word drive circuit shown in FIG. 7.

FIG. 10 is a diagram showing an exemplary arrangement of sub word drive circuit SWD shown in FIG. 7. Referring to FIG. 10, sub word drive circuit SWD includes: a P channel MOS transistor TR11 for transmitting a signal on main word line MWL to sub word line SWL in accordance with sub decode signal /SD; an N channel MOS transistor TR12 discharging sub word line SWL to attain to the ground voltage level in accordance with sub decode signal /SD; and an N channel MOS transistor TR13 discharging sub word line SWL to attain to the ground voltage level in response to the signal on main word line ZMWL. The signal on main word line MWL has an amplitude of Vpp, whereas a signal on complementary word line ZMWL has an amplitude of Vcc. Now, the operation of sub word drive circuit SWD shown in FIG. 10 will be briefly described.

When sub decode signal /SD is at the high voltage Vpp level, MOS transistor TR1 is in the off state. On the other hand, MOS transistor TR12 is turned on and sub word line SWL is discharged to attain to the ground voltage level. At the time, the signal potentials of main word lines MWL and ZMWL are not directly related to the potential of sub word line SWL.

When sub decode signal /SD is at the ground voltage level of the L level, MOS transistor TR12 is in the off state. On the other hand, MOS transistor TR11 is turned on or off in accordance with the signal potential of main word line MWL. When main word line MWL is at the ground voltage level, MOS transistor TR11 has equal gate and source voltages and is in the off state. At the time, complementary main word line ZMWL is at the H level (Vcc level), MOS transistor TR13 is turned on, and sub word line SWL is reliably discharged to attain to the ground voltage level. Thus, when MOS transistors TR11 and TR12 are both turned off, sub word line SWL is prevented from being brought into an electrically floating state.

On the other hand, when sub decode signal /SD is at the L level, if main word line MWL is driven to and attains to the high voltage Vpp level, MOS transistor TR11 is turned on and sub word line SWL is driven to and attains to the high voltage Vpp level. At the time, complementary main word line ZMWL is at the ground voltage level, and MOS transistors TR12 and TR13 are both in the off state.

As shown in FIG. 10, in sub word drive circuit SWD, by utilizing the signals on complementary main word lines and a sub decode signal (a sub word line selection signal) of a single end, 8 sub decode signals are provided in the sub word driver band as in the case of 4-way hierarchical word line structure. Sixteen sub decode signal lines must be arranged when complementary sub decode signals are used, whereby the interconnection line area increases or the pitch condition of the interconnection becomes severe. On the other hand, even if the complementary main word line pair is arranged, one main word line is arranged for 4 sub word lines. This is equivalent to the 4-way hierarchical word line structure, so that the main word line can be arranged with a sufficient margin.

Figure 11:
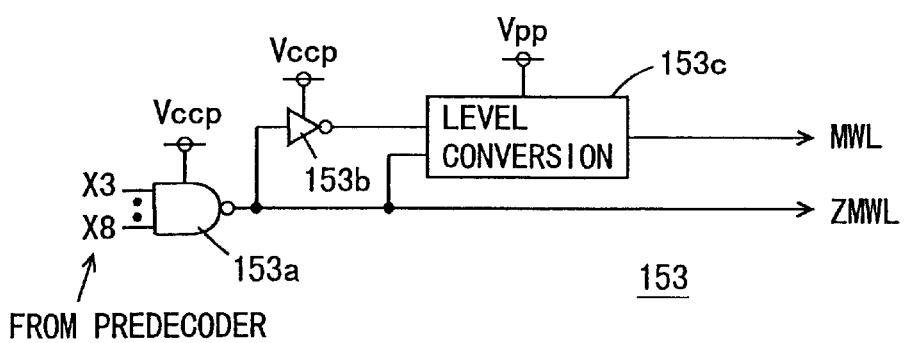
FIG. 11 is a diagram schematically showing an arrangement of a main decoder shown in FIG. 7.

FIG. 11 is a diagram schematically showing an arrangement of a unit decode circuit of main decoder 153. Referring to FIG. 11, main decoder 153 includes: an NAND circuit 153a receiving a predecode signal of address bits X8–X3 (RA–R3); an inverter 153b inverting an output signal from NAND circuit 153a; and a level conversion circuit 153c converting the voltage level of the output signal from inverter 153b for transmission to main word line MWL while receiving output signals from inverter 153b and NAND circuit 153a. A main word line selection signal is transmitted from NAND circuit 153a to complementary main word line ZMWL.

NAND circuit 153a and inverter circuit 153b receive a peripheral power supply voltage Vccp as an operation power supply voltage. Level conversion circuit 153c receives a high voltage Vpp as an operation power supply voltage for converting a signal which changes between ground voltage GND and peripheral power supply voltage Vccp to a signal which changes between high voltage Vpp and 0V (GND). In an active cycle, complementary main word line selection signals with different amplitudes can be transmitted onto main word lines MWL and ZMWL.

In a stand-by state, main word line MWL is maintained at the ground voltage level, and complementary main word line ZMWL is maintained at the peripheral supply voltage Vccp level. However, in the stand-by state, main word lines MWL and ZMWL may be both adapted to be maintained at the ground voltage level. The unit decode circuit is arranged for each main word line pair, so that complementary main word line selection signals can easily be generated and transmitted to the complementary main word line pair.

FIG. 12 is a diagram showing allocation of physical addresses in the memory array configuration shown in FIG. 4. Referring to FIG. 12, since there are 512 sub word lines, row addresses RA as physical addresses include addresses 0–511. As for column addresses CA, memory block MB#i has 128 columns as the physical addresses. Since there are 16 blocks in total, there are 2048 columns. The position of physical column address CA differs by 256 as row address RA differs by 1. More specifically, as shown in FIG. 12, for row address RA of (i−1), if physical column addresses CA are set as 0–2047, physical column address CA increases from 1920 to 2047 when row address RA is at i. Then, column addresses 0 to 1919 are sequentially allocated. For row address RA of (i+1), the column address further differs by 256, and column address sequentially increases from 1792 to 2047. Then, physical column addresses 0 to 1791 are sequentially allocated to the remaining columns.

The physical column addresses are allocated to respective physical row addresses while made differed by 256. This is because it is assumed that the same sub word line is selected in two memory blocks in the box mode. When physical address allocation as shown in FIG. 12 is used, the position of a selected memory cell in the logical space can be changed between the line and box modes.

More specifically, referring to FIG. 13A, when main word line MWL is selected in the line mode, sub word lines SWL in the same positions in 16 memory blocks are selected. Accordingly, in the selected region SER, the rows having the same row address are arranged. 128 sense amplifier circuits SA are arranged in one memory block, of which 8-bit data is read by the column address bits from 128 sense amplifier circuits SA. Thus, the memory block has a structure equivalent to that of 8 bits·16 columns. Namely, as shown in FIG. 13B, the logic X address changes in a range of 0 to 511, whereas the logic Y address changes in a range of 16×16= 256. There are 8 bits in a depth direction, so that 8 bit data is input/output. Logic address region (X, Y) allowing successive access to the word lines selected by one row access ranges from (i, 0) to (i, 255). The access ranges are not different except for the numbers of column accesses and memory blocks in a conventional 8-way hierarchical word line method.

Figure 14A:
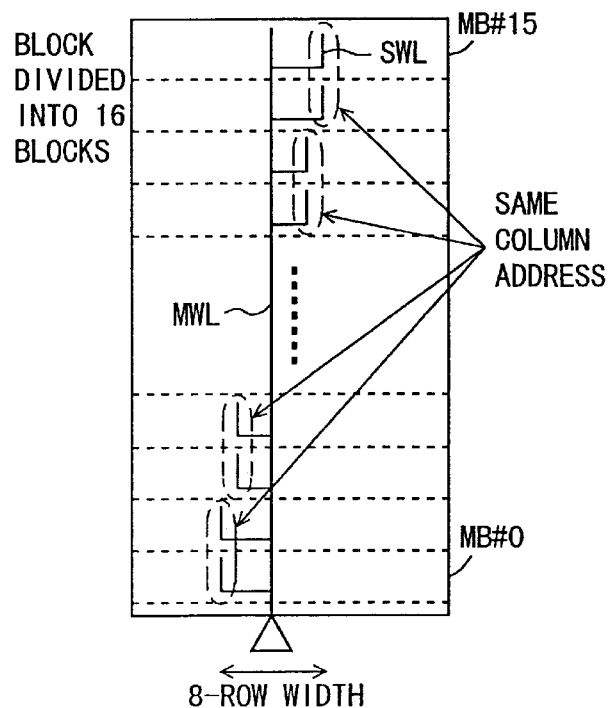
FIG. 14A is a diagram showing positions of selected sub word lines in a box mode.

On the other hand, in the box mode, sub word lines SWL with a 8-row width are selected for main word line MWL, as shown in FIG. 14A. In this sub-word line selection, the sub-word lines are selected such that in each pair of memory blocks, the sub-word lines at the same row are selected while in each adjacent pairs of memory blocks, the sub-word lines shifted in position by one row are selected. Column addresses are allocated to the row addresses with 256 columns shifted for each row address, and the logical column addresses in selected sub word lines SWL shown in FIG. 14A are all the same.

Figure 14B:
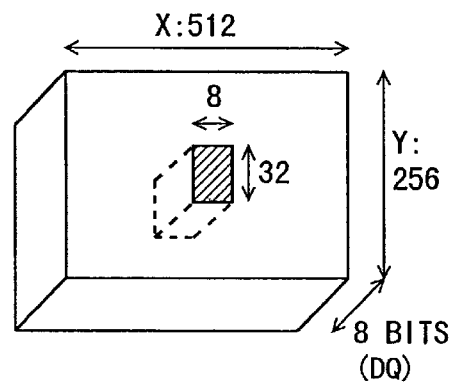
FIG. 14B is a diagram showing a region of a selected memory cell at a logic address space in the box mode.

Selected sub word lines SWL are distributed in various patterns according to the sub decode signals. However, the sub word lines are selected such that they are different by one row in a cyclic manner in a direction from memory block MB#0 to MB#15 in the adjacent memory block pairs. The column addresses are arranged in the same patterns in a cyclic manner at a period of 8-row addresses. The same column is always selected regardless of the pattern of the selected sub word lines. The logical column address regions with respect to two memory blocks are selected and, as shown in FIG. 14B, the selected region is 8(X)·32(Y)·8 (DQ). In the box mode, the selected logical address region (X, Y) is a rectangular region of (i, j) to (i+7, j+31).

In the conventional DRAM having only a line mode of the present invention, to write data to the entire region of 512 rows·256 columns, the word lines must be activated 512 times. In addition, to sequentially perform operations on the regions of 8 rows·8 columns, the word lines must be activated eight times in each unit region and there are 64·32 regions each of 8 rows·8 columns in the region of 512 rows·256 columns. Thus, row access must be performed 64·32·8=16384 times. Accordingly, for example in image processing, input video signals from a CCD (Charge Coupled Device; solid state image sensor device) are stored in a raster scan sequence. Thereafter, in order to read data in 8·8 pixel region units for DCT transformation, row access must be performed 16896 times. Thus, the overhead in switching the row address significantly increases and fast data transfer cannot be achieved.

According to the present embodiment, first, the video signal applied in a raster scan sequence from a pickup device such as a CCD are stored in the region of 512 rows·256 columns in accordance with the line mode. In this case, row access must be performed 512 times. On the other hand, in a box mode for DCT process, the region of 8 rows·32 columns is selected by one row access, so that row access is performed 512·256/(8·32)=512 times. A unit block of 8 pixels·8 pixels is read in a so-called raster scan sequence in a DCT transformation process. Thus, 4 unit blocks can be successively read by one row access. Accordingly, when input video signals from a pickup device such as CCD are stored in the DRAM and then data transfer is performed for the DCT transformation process, the data can be transferred by performing row access 1024 times in total. Thus, as compared with the conventional case, the number of times of the input of the row access command can be reduced to about 1/16 times.

When data is written in the line mode and read in the box mode, assuming that a delay corresponding to 2 clock cycles is caused for row access (data transfer is stopped) and data writing/reading is always enabled starting from the next clock cycle, the number of clock cycles required for data transfer is 1024·2+(512·256)·2=264192 cycles since column access is performed in both writing and reading. On the other hand, when data transfer is performed only in the line mode as in the conventional case, the number of required clock cycles is 16896·2+(512·256)·2=295936. Thus, in the present embodiment, pixel data can be transferred with the clock cycles about 10% less than the conventional case. Actually, in data reading, a delay time in row access increases because of a column latency. Thus, the number of clock cycles required for data transfer further decreases for fast data transfer. In addition, since the number of row accesses is reduced to about 1/16 times, the number of operations of the row related circuit is correspondingly reduced, whereby a power consumption related to word line selection and sensing operation can be significantly reduced.

First Modification

Figure 15:
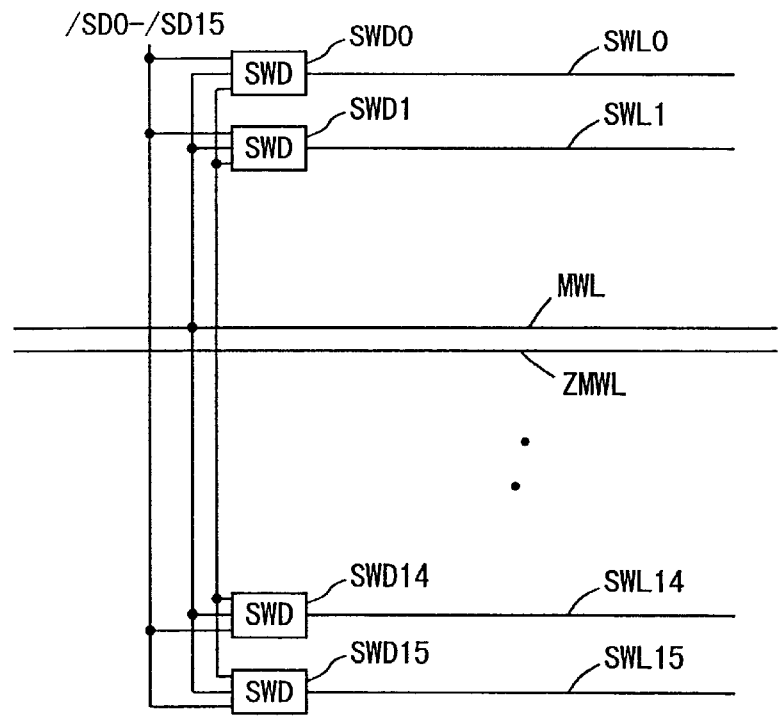
FIG. 15 is a diagram schematically showing a configuration of a main portion of a first modification of the first embodiment of the present invention.

FIG. 15 is a diagram schematically showing a configuration of a main portion of a modification of the first embodiment of the present invention. In the configuration shown in FIG. 15, 16 sub word lines SWL0–SWL15 are arranged for a pair of main word lines MWL and ZMWL. Sub word drive circuits SWD0–SWD15 are arranged corresponding to sub word lines SWL0–SWL15. Sub word drive circuits SWD0–SWD15 drive corresponding sub word lines into a selected state in accordance with corresponding sub decode signals /SD0–/SD15 and signals on the pair of main word lines MWL and ZMWL. The other parts of the configuration are the same as those of the above described first embodiment.

Figure 16A:
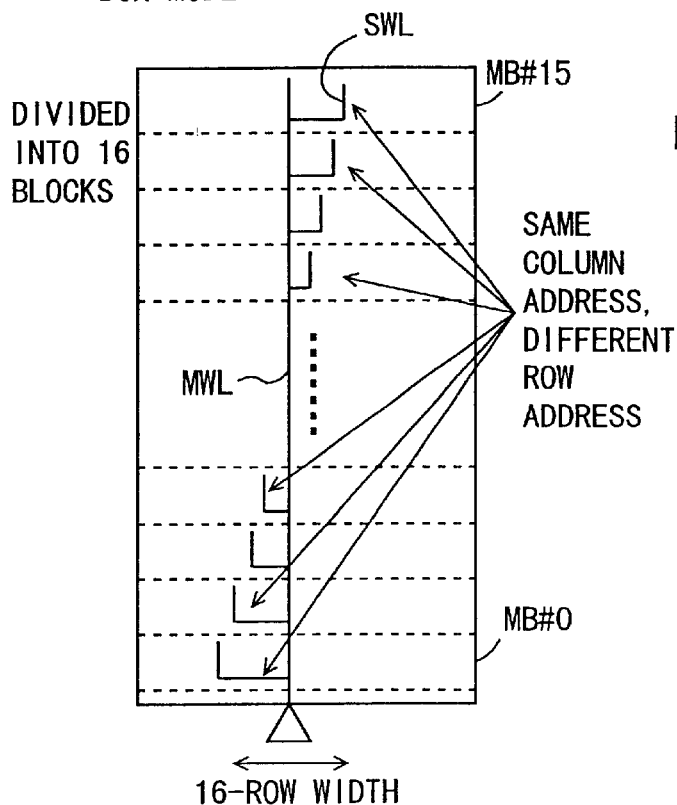
FIG. 16A is a diagram showing positions of selected sub word lines in the first modification.
Figure 16B:
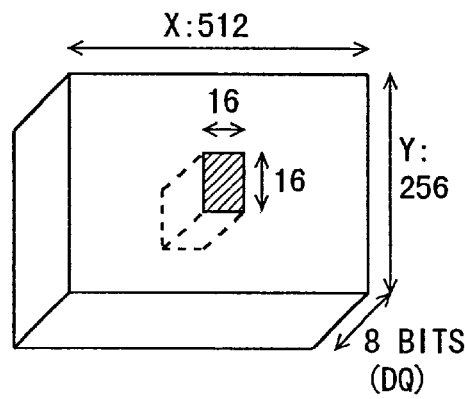
FIG. 16B is a diagram showing a position of the selected region in a logic address space in a box mode according to the first modification.

FIG. 16A is a diagram showing a distribution of the selected sub word lines in the box mode in the first modification. As shown in FIG. 16A, in the box mode, sub word lines SWL in different positions in memory blocks MB#0–MB#15 are selected. In this case, the physical column address is shifted by 128 for every row address and the physical column addresses are allocated to logic addresses in a cyclic manner. 128 sense amplifier circuits SA are arranged in each of memory blocks MB#0–MB#15 and 8-bit data is read, so that one sub word line SWL corresponds to 16 logical column addresses. Accordingly, as shown in FIG. 16B, the region of 16 rows·16 columns (depth of 8 bits) is selected in this case. In image processing and encoding of a so-called motion picture image, a motion vector is detected in accordance with a block matching method, and prediction encoding is performed based on the motion vector. Normally, a motion vector is searched with a macro block of 16 pixels·16 pixels being one unit. Accordingly, in this case, pixel data of the macro block of 16·16 pixels can be sequentially transferred by one row access.

Figure 17:
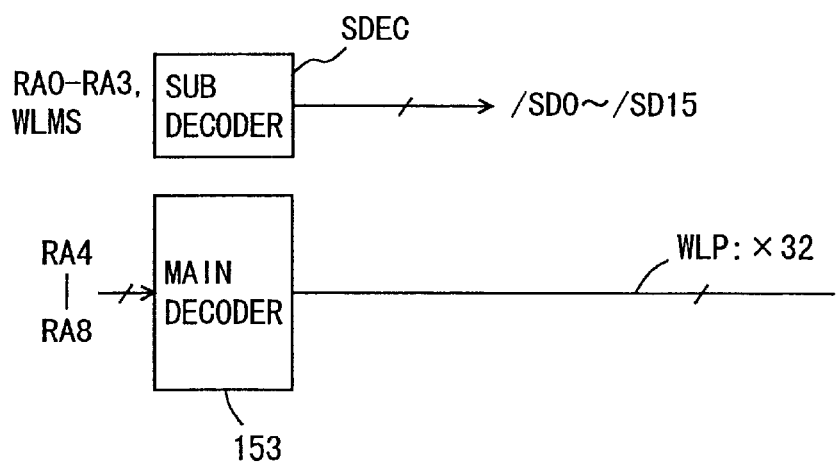
FIG. 17 is a diagram schematically showing an arrangement of the word line selection circuit of the first modification of the first embodiment of the present invention.

FIG. 17 is a diagram schematically showing an arrangement of a decoder portion of the first modification. Main word line pair WLP includes main word lines MWL and ZMWL, and there are 32 pairs of main word lines in total. Main decoder 153 decodes row address bits RA4–RA8 and selects one of 32 pairs of main word lines. Sub decoder band SDEC generates sub decode signals /SD0–/SD15 in accordance with 4-bit row address RA0–RA3 and word line mode designation signal WLMS. The correspondence relationship between the decode signal and sub decode signal in the sub decode circuits of each sub decoder band SDEC is determined by expanding the row shown in the previously referenced FIG. 6A. 16-bit sub decode signals are sequentially shifted in a cyclic manner, and the sub decode signal to be activated is allocated to each sub decoder band.

As described above, according to the configuration of the first modification, 16 sub word lines are arranged for a main word line pair, rectangular regions of 16 pixels can be simultaneously selected, and data can be transferred at high speed in performing an image process on pixel data.

Second Modification

Figure 18A:
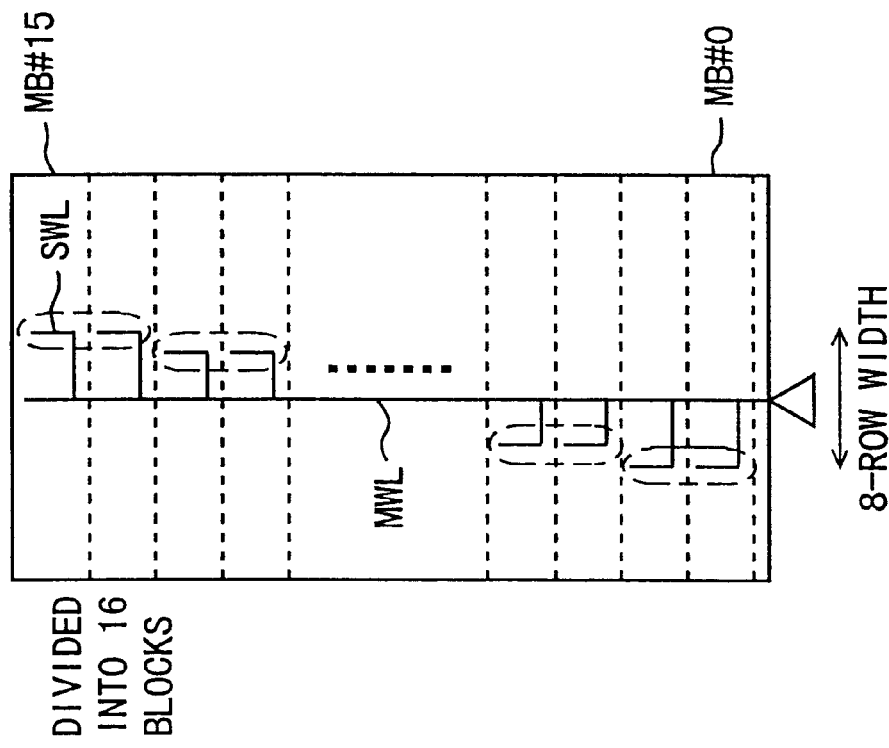
FIG. 18A is a diagram showing positions of selected sub word lines in a box mode 1 of a second modification of the first embodiment of the present invention.
Figure 18B:
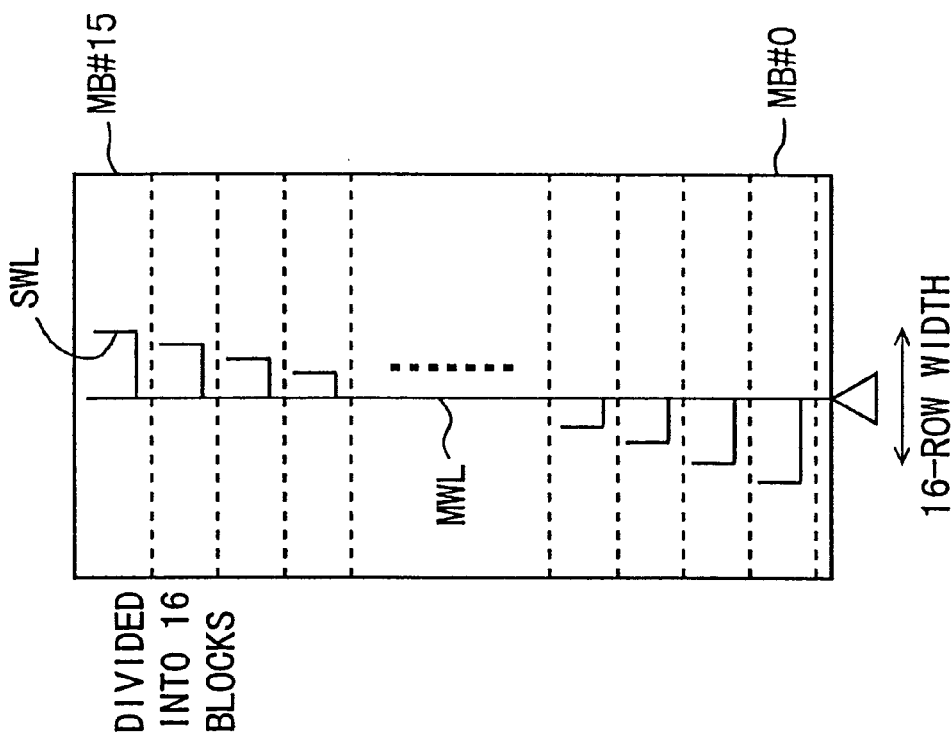
FIG. 18B is a diagram showing the positions of the selected sub word lines in a box mode 2 of the second modification.

FIGS. 18A and 18B are diagrams showing configurations of the second modification of the first embodiment of the present invention. FIGS. 18A and 18B are related to box modes 1 and 2, respectively. When box mode 1 is designated, sub word lines in different positions of 16 memory blocks are simultaneously selected as shown in FIG. 18A. On the other hand, when box mode 2 is designated, different sub word lines are selected with two memory blocks being a unit as shown in FIG. 18B. Box mode 2 corresponds to the box mode of the previously described first embodiment, whereas box mode 1 corresponds to the box mode of the first modification. In box mode 1, the region of 16(X)·16(Y) is selected. In box mode 2, the region of 8(X)·32(Y) is selected. Thus, a memory cell block of an optimum size can be selected according to a process of DCT and compensation with the motion vector. In box modes 1 and 2, the column address is shifted by 128 every time the physical row address is incremented/ decremented. Pixel data of top and bottom fields are stored in even and odd rows respectively in the case of field image. A frame image includes one top field and one bottom field. A frame image is processed in box mode 1, and the frame image or a field image is processed in box mode 2.

Figures 19, 20:
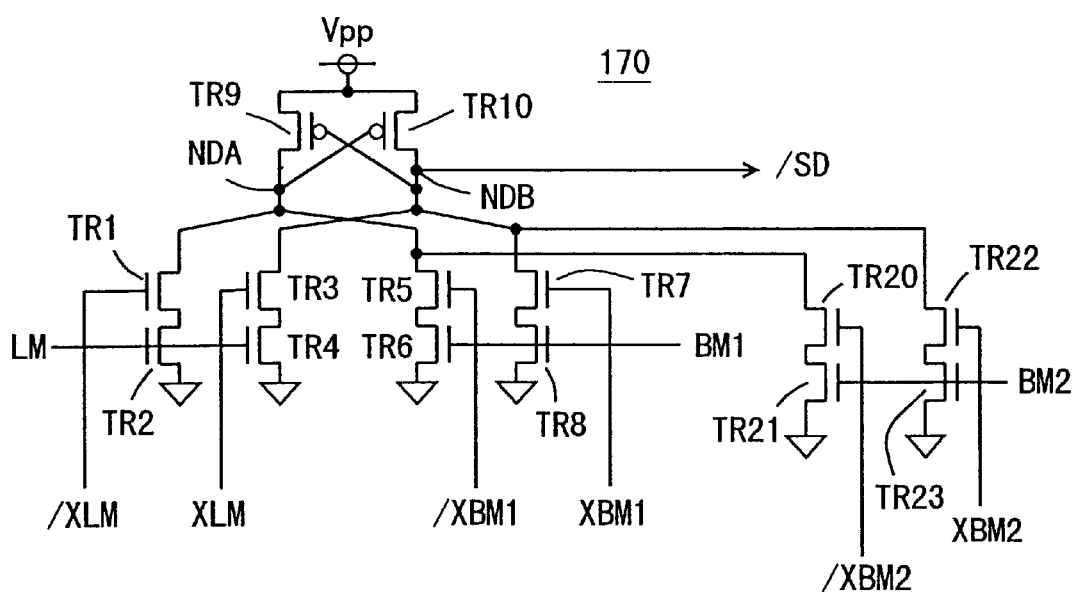
FIG. 19 is a diagram showing positions of the selected sub word lines in a word line selection mode in the second modification.
FIG. 20 is a diagram showing an arrangement of a sub decode signal generation circuit according to the second modification.

FIG. 19 is a diagram showing positions of the selected sub word lines in each word line selection mode of the second modification of the first embodiment of the present invention. Referring to FIG. 19, when line mode designation signal LM is activated, the same sub decode signals /SDi are all activated in sub decoder bands SEDC0–SDEC15. On the other hand, when box mode 1 is designated and box mode designation signal BM1 is activated, sub decode signals /SDi–/SD(i+15) are activated in sub decoder bands SEDC0–SDEC15 respectively. Here, addition is related to a system of residues of 16 (addition of mod. 16). On the other hand, when designation signal BM2 is activated in box mode 2, the positions of sub decode signals to be activated are different with two memory blocks being a unit. Namely, when sub decode signal /SDi is activated in sub decoder bands SDEC0 and SDEC1, sub decode signal /SD(i+1) is activated in sub decoder bands SDEC2 and SDEC3. Accordingly, in this case, 8 sub decode signals /SDi–/SD(i+7) are activated with two memory blocks being a unit. Although allocation of the logical column addresses must be changed between box modes 1 and 2, the region of 8 rows·32 columns of a frame image can be selected in box mode 2. If sub word lines are selected with two memory blocks being a unit in alternate, sub decode signals /SDi, /SDi+2 . . . /SDi+14 are activated, so that the field image can be processed. In this case, allocation of logical row addresses needs not be changed between box modes 1 and 2.

FIG. 20 is a diagram showing an arrangement of a sub decode signal generation circuit. The sub decode signal generation circuit shown in FIG. 20 includes, in addition to the arrangement shown in FIG. 9: N channel MOS transistors TR20 and TR21 connected in series between a node NDA and a ground node for selecting a sub decode signal in accordance with box mode 2 and having their gates receiving a signal applied to input node /XBM2 and box mode designation signal BM2 respectively; and an N channel MOS transistors TR22 and TR 23 connected in series between node NDB and the ground node and having their respective gates receiving a signal applied to node /XBM2 and box mode designation signal BM2.

In a line mode operation, MOS transistors TR1 and TR3 are selectively rendered conductive in accordance with the signals applied to nodes /XLM and XLM. When box mode designation signal BM1 is in an active state, MOS transistors TR6 and TR8 are rendered conductive, and MOS transistors TR5 and TR7 are selectively turned on in accordance with the signals applied to nodes /XBM1 and XBM1. In box mode 2, MOS transistors TR21 and TR23 are rendered conductive in accordance with box mode designation signal BM2, and MOS transistors TR20 and TR22 are selectively rendered conductive in accordance with the signals applied to nodes /XBM and XBM2. Thus, sub decode signal /SD from node NDB is set in accordance with line mode designation signal LM as well as box mode designation signals BM1 and BM2. The correspondence relationship between the decode signal and the sub decode signal is set for each sub decoder band with an interconnection.

As described above, according to the second modification of the first embodiment of the present invention, there are a plurality of box modes, so that the process content of the region of the selected memory cell can correspondingly be changed, and the memory cell can be selected flexibly according to a process content for fast data transfer.

Third Modification

Figure 21:
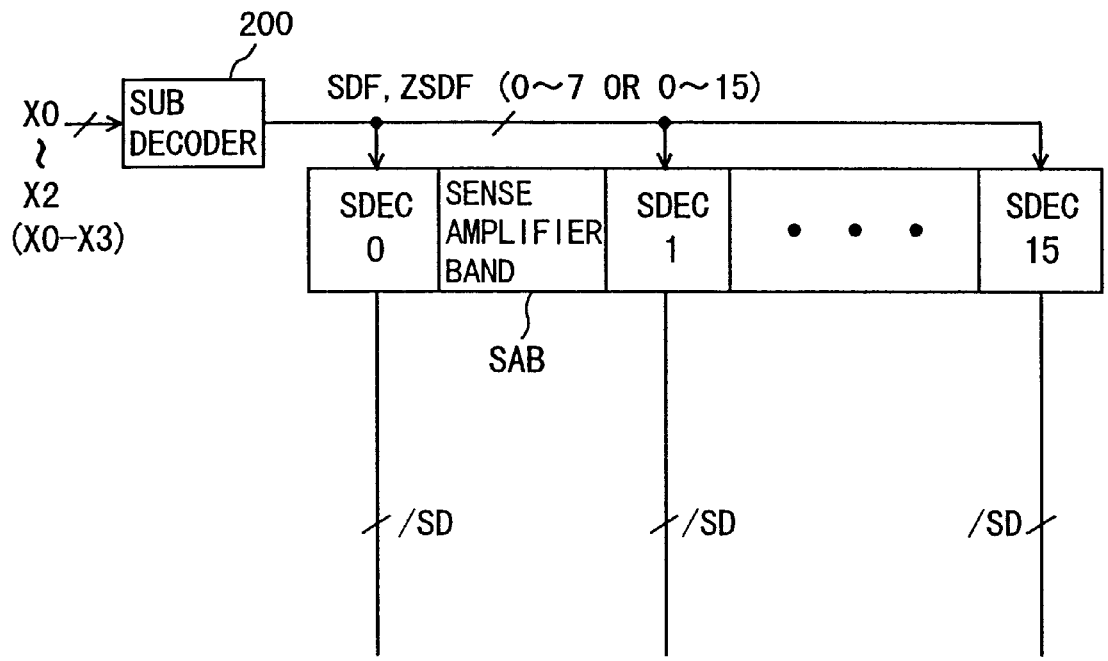
FIG. 21 is a diagram schematically showing an arrangement of a main portion of a third modification of the first embodiment of the present invention.
Figure 22:
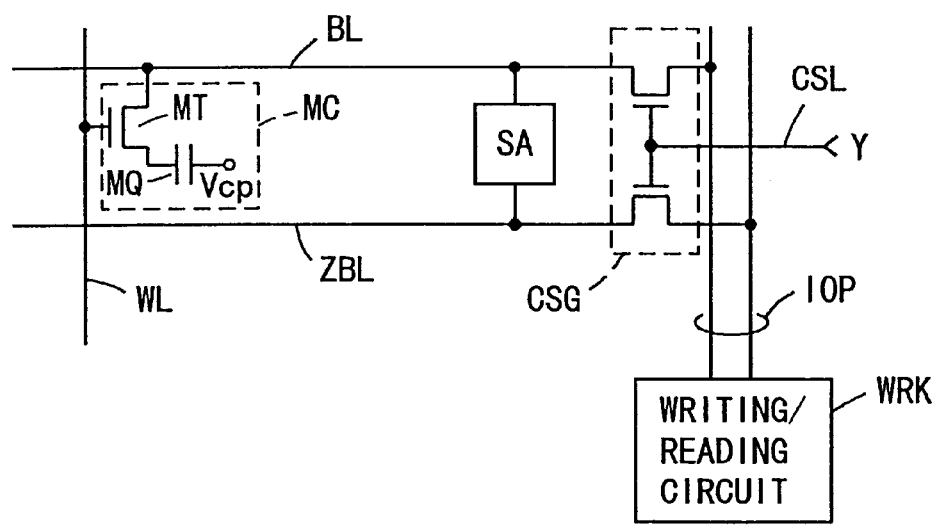
FIG. 22 is a diagram schematically showing an arrangement of a memory array portion of a conventional semiconductor memory device.
Figure 23:
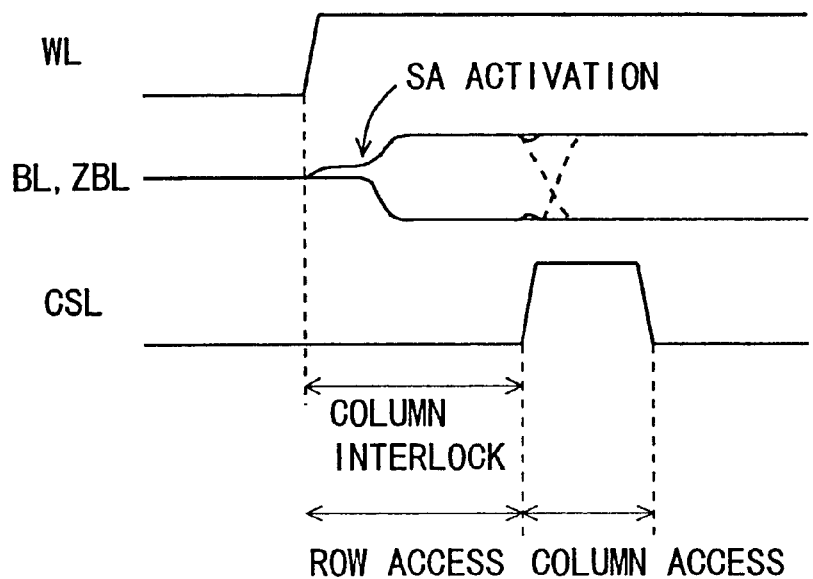
FIG. 23 is a diagram showing signal waveforms presenting data accessing operation of the conventional semiconductor memory device.
Figure 24:
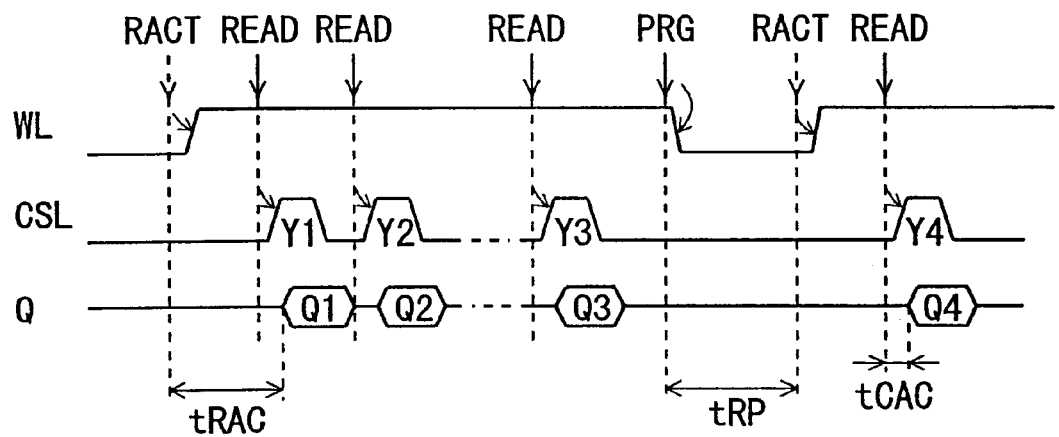
FIG. 24 is a timing chart showing an exemplary data access sequence of the conventional semiconductor memory device.

FIG. 21 is a diagram schematically showing an arrangement of a third modification of the first embodiment of the present invention. Referring to FIG. 21, a sub decoder 200 is arranged being shared by sub decoder bands SEDC0–SDEC15, for decoding row address bits X0–X2 (or X0–X3) and generating sub decode fast signals SDF and ZSDF. In sub decoder bands SEDC0–SDEC15, a sub decode signal generation circuit shown in FIG. 20 or FIG. 9 is provided for each sub decode signal /SD. In this case, a sub decode circuit needs not be provided in each of sub decoder bands SEDC0–SDEC15, so that a chip real estate of the circuitry is reduced. Level conversion is performed in sub decoder bands SDEC0–SDEC15 in accordance with sub decode fast signals SDF (SDF0–SDF7 or SDF0–SDF15) and ZSDF (ZSDF0–ZSDF7 or ZSDF0–ZSDF15), and sub decode signal /SD is driven into a selected state in accordance with a word line selection mode.

It is noted that, in the arrangement shown in FIG. 21, sub decoder 200 may be so structured as to generate only sub decode fast signal SDF or ZSDF and a complementary sub decode fast signal pair may be generated in sub decoder bands SEDC0–SDEC15. In this case, the number of signal interconnection lines from sub decoder 200 can be reduced. In addition, sub decoder 200 may be provided with a function of level conversion to generate sub decode fast signal SDF or ZSDF at a high voltage Vpp level.

As described above, according to the third modification of the first embodiment of the present invention, the sub decoder is shared by sub decoder bands SDEC0–SDEC15, so that the chip real estate of the sub decoder can be reduced. It is noted that a signal line from sub decoder 200 is arranged in the sense amplifier band.

Another Arrangement

In the above described arrangement, there are 8 or 16 sub decode signal lines. However, the present invention is not limited to this, and any number of signal lines, for example 4 signal lines, may be provided. In addition, the memory array is divided into 16 memory blocks and the word line is divided into 16 sub word lines. However, the word line may be divided into any number of sub-word lines and, for example, 8-division word line arrangement may be employed (note that at least 16-division word line arrangement is required if 16 rows are to be simultaneously selected).

Further, for selection pattern of the sub word lines, the sub word lines are selected starting from sub decoder band SDEC0 and sequentially shifted by one row downwardly in a cyclic manner. However, a word line (a sub word line) may be selected in the opposite direction in a set of sub word lines. In addition, the sub word lines may be selected in a different pattern. A selection pattern may appropriately be determined in accordance with application.

Moreover, the word line selection patterns of line and box modes or box modes 1 and 2 have been described. However, a different word line selection pattern may be set in accordance with the operation mode designation signal.

The selection mode of the word lines is designated in accordance with the externally applied word line mode designation signal. In this case, the word line selection mode may not be designated every time a row access command is applied. At the start of the image process, the word line selection mode may be set in a command register of the DRAM and word line (main/sub word line) selection may be performed in accordance with the word line selection mode set in the command register.

In the basic arrangement shown in FIG. 4, the sense amplifier bands are arranged only on one side of the memory block. However, the sense amplifier bands may be arranged on either side of the basic array to provide an alternately arranged shared sense amplifier configuration in which the sense amplifiers are arranged on either side of the memory block in alternate columns, to provide a similar effect.

As described above, according to the present invention, the selection pattern of the word line is changed in accordance with the operation mode, so that the number of row accesses can be reduced by employing the word line selection pattern according to application for fast data transfer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
    a memory array having a plurality of memory cells arranged in rows and columns and divided into a plurality of memory blocks in a row direction;
    a plurality of main word lines each corresponding to the memory cells on a prescribed number of rows of said memory array and shared by said plurality of memory blocks;
    a plurality of sub word lines arranged corresponding to rows of the memory cells of the memory blocks and each connected to the memory cells of a corresponding row;
    a main word line selection circuit for selecting a main word line arranged corresponding to an addressed row of said plurality of main word lines in accordance with a first address signal bit;
    a plurality of sub decode circuits arranged corresponding to said plurality of memory blocks and each decoding a second address signal bit and generating a sub word line designation signal designating a row of a set of said prescribed number of rows in accordance with a decoding result, each of the sub decode circuits including a changing circuit for changing a correspondence relationship between a decode signal representing the decoding result and the sub word line designation signal in accordance with a page geometry designation signal; and
    a plurality of sub word line drive circuits arranged corresponding to respective sub word lines for driving said respective sub word lines into a selected state in accordance with said sub word line designation signal and signals on corresponding main word lines.

2. The semiconductor memory device according to claim 1, wherein each of said plurality of sub decode circuits includes a plurality of unit decode circuits arranged corresponding to said prescribed number of rows for decoding said second address signal bit, and
    said changing circuit includes a plurality of unit changing circuits arranged corresponding to said prescribed number of rows each for selecting and outputting one of decode signals output from predetermined unit decode circuits in accordance with said page geometry designation signal, and one of output signals from said plurality of unit changing circuits is activated to be said sub word line designation signal.

3. The semiconductor memory device according to claim 2, wherein each of the main word lines includes a pair of first and second word lines for transmitting complementary main word line selection signals, and
    each of the sub word line drive circuits includes a drive circuit for driving a corresponding sub word line into a selected state in accordance with an output signal from a corresponding unit changing circuit and signals on a corresponding pair of the first and second word lines.

4. The semiconductor memory device according to claim 1, wherein the main word line includes a pair of first and second word lines for transmitting complementary main word line selection signals, and
    each of the sub word line drive circuits includes a drive circuit for driving a corresponding sub word line in accordance with said sub word line designation signal and signals on said pair of first and second word lines.

5. The semiconductor memory device according to claim 1, further including a column selection circuit performing a column selection on a basis of the memory block of said memory array and selecting memory cells of plural bits from a designated memory block for data access.

6. The semiconductor memory device according to claim 1, wherein said plurality of sub decode circuits are arranged corresponding to said plurality of memory blocks and each transmitting said sub word line designation signal to a corresponding memory block.

7. The semiconductor memory device according to claim 1, further comprising a word line mode control circuit for generating said page geometry designation signal in accordance with an externally applied word line mode selection signal.

8. The semiconductor memory device according to claim 1, further comprising a latch circuit for latching and outputting an externally applied word line mode selection signal, and
    a page geometry control circuit for generating said page geometry designation signal in accordance with an output signal from said latch circuit and a row selection timing control signal.

9. The semiconductor memory device according to claim 1, wherein said prescribed number is a natural number multiple of 8, and a number of the memory blocks is a natural number multiplied by 8.

10. The semiconductor memory device according to claim 1, wherein physical addresses of the memory cells are determined such that memory cells on simultaneously selected rows in memory blocks in which different rows are designated, are allocated with common logical column addresses.

11. A semiconductor memory device, comprising:
    a memory array having a plurality of memory cells arranged in rows and columns and divided into a plurality of memory blocks in a row direction;
    a plurality of main word lines each shared by said plurality of memory blocks and each arranged corresponding to a prescribed number of rows of said memory array, each of said plurality of main word lines including a pair of first and second word lines for transmitting complementary signals;
    a plurality of sub decode circuits arranged corresponding to said plurality of memory blocks for generating sub decode signals designating a row of said prescribed number of rows of corresponding memory blocks in accordance with a first address bit; and a plurality of sub word drivers arranged corresponding to said plurality of sub word lines each for driving a corresponding sub word line into a selected state in accordance with a corresponding sub decode signal and signals on the first and second word lines of a corresponding main word line.

12. The semiconductor memory device according to claim 11, wherein each of said plurality of sub decode circuits includes a circuit for changing a correspondence relationship between said first address bit and the designated row of said prescribed number of rows in response to a page geometry changing signal.

13. The semiconductor memory device according to claim 11, further comprising a column selection circuit for selecting memory cells of plural bits from one of said plurality of memory blocks in accordance with a column address bit for data access.

14. The semiconductor memory device according to claim 11, wherein physical addresses of the memory cells are determined such that memory cells on simultaneously selected rows in memory blocks in which different rows are designated, are allocated with common logical column addresses.

* * * * *